(12) United States Patent
Chang et al.

(10) Patent No.: US 10,515,960 B2
(45) Date of Patent: Dec. 24, 2019

(54) SEMICONDUCTOR DEVICE AND METHOD

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/222,300

(22) Filed: Dec. 17, 2018

(65) Prior Publication Data
US 2019/0123048 A1 Apr. 25, 2019

Related U.S. Application Data

(63) Continuation of application No. 15/623,066, filed on Jun. 14, 2017, now Pat. No. 10,157,918.

(60) Provisional application No. 62/370,584, filed on Aug. 3, 2016, provisional application No. 62/405,787, filed on Oct. 7, 2016.

(51) Int. Cl.
| | |
|---|---|
| H01L 27/148 | (2006.01) |
| H01L 29/80 | (2006.01) |
| H01L 21/00 | (2006.01) |
| H01L 27/088 | (2006.01) |
| H01L 21/8234 | (2006.01) |
| H01L 29/66 | (2006.01) |
| H01L 29/78 | (2006.01) |

(52) U.S. Cl.
CPC .. *H01L 27/0886* (2013.01); *H01L 21/823431* (2013.01); *H01L 21/823481* (2013.01); *H01L 29/66795* (2013.01); *H01L 29/785* (2013.01); *H01L 29/7848* (2013.01); *H01L 29/66545* (2013.01)

(58) Field of Classification Search
CPC ..... H01L 21/823431; H01L 21/823487; H01L 21/823821; H01L 21/823885; H01L 27/0886; H01L 27/0924; H01L 29/66545; H01L 29/66795; H01L 29/785; H01L 29/78642

See application file for complete search history.

(56) References Cited

U.S. PATENT DOCUMENTS

| | | | |
|---|---|---|---|
| 8,377,779 | B1 | 2/2013 | Wang |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |

(Continued)

*Primary Examiner* — Hsien Ming Lee
(74) *Attorney, Agent, or Firm* — Slater Matsil, LLP

(57) ABSTRACT

A representative method for manufacturing fin field-effect transistors (FinFETs) includes steps of forming a plurality of fin structures over a substrate, and forming a plurality of isolation structures interposed between adjacent pairs of fin structures. Upper portions of the fin and isolation structures are etched. Epitaxial structures are formed over respective fin structures, with each of the epitaxial structures adjoining adjacent epitaxial structures. A dielectric layer is deposited over the plurality of epitaxial structures with void regions formed in the dielectric layer. The void regions are interposed between adjacent pairs of fin structures.

20 Claims, 22 Drawing Sheets

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,570,555 B1 | 2/2017 | Pranatharthiharan et al. |
| 9,576,814 B2 | 2/2017 | Wu et al. |
| 2014/0117455 A1 | 5/2014 | Liu et al. |
| 2015/0035023 A1* | 2/2015 | Kim .................... H01L 29/785 257/288 |
| 2015/0102422 A1 | 4/2015 | Cai et al. |

* cited by examiner

SEMICONDUCTOR DEVICE AND METHOD

PRIORITY CLAIM AND CROSS-REFERENCE

This application is a continuation of U.S. patent application Ser. No. 15/623,066, filed on Jun. 14, 2017, entitled "SEMICONDUCTOR DEVICE AND METHOD," which claims priority to and the benefit of U.S. Provisional Application No. 62/370,584, filed on Aug. 3, 2016, entitled "DIFFERENTIAL SOURCE/DRAIN EPITAXIAL STRUCTURES AND METHODS OF FORMING SAME," and U.S. Provisional Application No. 62/405,787, filed on Oct. 7, 2016, entitled "SEMICONDUCTOR DEVICE AND METHOD," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating layers, conductive layers, and semiconductive layers of material over a semiconductor substrate. The various material layers are patterned using lithography to form circuit components and elements thereon.

The semiconductor industry continues to improve integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of illustration or discussion.

DETAILED DESCRIPTION

Figure 1:
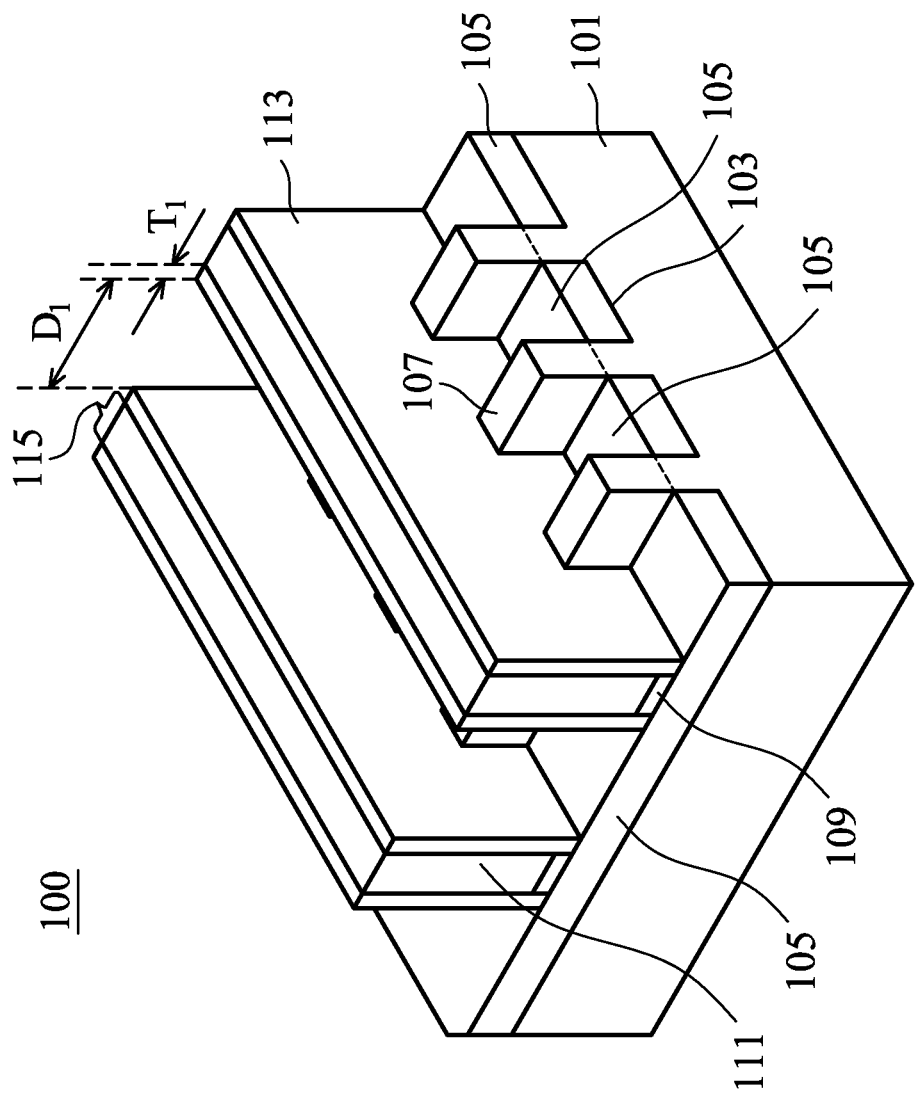
FIG. 1 illustrates a representative intermediate structure in a process of forming a fin field-effect transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 representatively illustrates a perspective view of a semiconductor device 100 such as a fin field-effect transistor (FinFET) device. In an embodiment, semiconductor device 100 comprises substrate 101 with first trenches 103 formed therein. Substrate 101 may be a silicon substrate, although other substrates, such as semiconductor-on-insulator (SOI), strained SOI, and silicon germanium on insulator, could be used. Substrate 101 may be a p-type semiconductor, although in other embodiments, it could be an n-type semiconductor.

First trenches 103 may be formed as an initial step in eventual formation of first isolation regions 105. First trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of substrate 101 that will be removed to form first trenches 103.

As one of skill in the art will appreciate, however, the processes and materials described above to form the masking layer are not the only methods that may be used to protect portions of substrate 101 while exposing other portions of substrate 101 for the formation of the first trenches 103. Any suitable process, such as a patterned and developed photoresist, may be utilized to process portions of substrate 101 to form first trenches 103. All such methods are included in the scope of representative embodiments described herein.

Once a masking layer has been formed and patterned, first trenches 103 are formed in substrate 101. Exposed substrate 101 portions may be removed through a suitable process, such as reactive ion etching (RIE), in order to form first trenches 103 in substrate 101, although any suitable process may be used. In an embodiment, first trenches 103 may be formed to have a depth of less than about 5,000 Å from the surface of the substrate 101, such as about 2,500 Å.

However, as one of ordinary skill in the art will appreciate, processes described above to form first trenches 103 are merely representative examples. Any suitable process by which first trenches 103 may be formed may be alternatively, conjunctively, or sequentially utilized. Any suitable process, including any number of masking and removal steps, may be used.

Additionally, if desired, intra-fin first trenches (those first trenches 103 located between adjacent ones of the fins 107 which share a common gate) may be formed to have a smaller depth than inter-fin first trenches 103 (those first trenches 103 located outside of adjacent ones of the fins 107 which share a common gate). For example, fins 107 which will be used to form PFET devices may utilize both inter-fin first trenches 103 and intra-fin first trenches 103 that have a similar depth, while fins 107 which will be used to form NFET devices may utilized inter-fin first trenches 103 which a smaller depth than intra-fin first trenches 103. However, any suitable combination may be utilized.

In addition to forming first trenches 103, masking and etching processes additionally form fins 107 from portions of substrate 101 that remain after processing. For convenience, fins 107 have been illustrated in the Figures as being separated from substrate 101 by a dashed line, although a physical indication of the separation may or may not be present. Fins 107 may be used, as discussed later herein, to form channel regions of multiple-gate FinFET transistors. While FIG. 1 representatively illustrates three fins 107 formed from substrate 101, any number of fins 107 may be utilized.

Fins 107 may be formed such that they have a width at a surface of substrate 101 of between about 5 nm and about 80 nm, such as about 30 nm. Additionally, fins 107 may be spaced apart from each other by a distance of between about 10 nm and about 100 nm, such as about 50 nm. By spacing fins 107 in such a fashion, fins 107 may each form a substantially separate channel region while still being close enough to share a common gate.

Once first trenches 103 and fins 107 have been formed, first trenches 103 may be filled with a dielectric material, and the dielectric material may be recessed within first trenches 103 to form first isolation regions 105. The dielectric material may be an oxide material, a high-density plasma (HDP) oxide, or the like. The dielectric material may be formed, after an optional cleaning and lining of first trenches 103, using either a chemical vapor deposition (CVD) method (e.g., a HARP process), a high-density plasma CVD method, or other suitable method of formation, as known in the art.

First trenches 103 may be filled by overfilling first trenches 103 and substrate 101 with the dielectric material and then removing excess material outside of first trenches 103 and fins 107, e.g., through a suitable process such as chemical mechanical polishing (CMP), an etch, a combination of these, or the like. In an embodiment, the removal process eliminates dielectric material that is located over fins 107 as well, so that removal of the dielectric material will expose a surface of fins 107 for subsequent processing.

Once first trenches 103 have been filled with dielectric material, the dielectric material may then be recessed away from the surface of fins 107. Recession may be performed to expose at least a portion of sidewalls of fins 107 adjacent to a top surface of fins 107. The dielectric material may be recessed, e.g., using a plasma etching which utilizes a plasma from a one or more etchants including $CH_4$, $CF_4$, $CH_2F_2$, $CHF_3$, $O_2$, HBr, $Cl_2$, $NF_3$, $N_2$ and/or He. The recessing may be performed at a pressure of between about 3 mTorr to about 20 mTorr and a temperature of between about 30° C. and about 80° C., although any suitable temperature and pressure may be utilized. However, other removal methods, such as wet etching using an etchant such as HF, or $H_2$, a dry etch with etchants such as $NH_3/NF_3$, chemical oxide removal, or dry chemical clean may be alternatively, conjunctively, or sequentially employed. The dielectric material may be recessed to a distance from the surface of fins 107 of between about 50 Å and about 500 Å, such as about 400 Å. Additionally, the recessing may also remove leftover dielectric material located over fins 107 to ensure that fins 107 are exposed for further processing.

As one of ordinary skill in the art will appreciate, however, steps described above may be only part of an overall process flow used to fill and recess the dielectric material. For example, lining steps, cleaning steps, annealing steps, gap-filling steps, combinations of these, or the like may also be utilized to form and fill first trenches 103 with the dielectric material. All such potential process steps are included within the scope of representative embodiments described herein.

After first isolation regions 105 have been formed, dummy gate dielectric 109, dummy gate electrode 111 over dummy gate dielectric 109, and first spacers 113 may be formed over each of fins 107. In an embodiment, dummy gate dielectric 109 may be formed by thermal oxidation, chemical vapor deposition (CVD), sputtering, or any other methods (whether now known or hereafter derived in the art) for forming a gate dielectric. Depending on the technique of gate dielectric formation, a dummy gate dielectric 109 thickness on the top of fins 107 may be different from a gate dielectric thickness on a sidewall of fins 107.

Dummy gate dielectric 109 may comprise a material such as silicon dioxide or silicon oxynitride with a thickness ranging from about 3 angstroms (Å) to about 100 Å, such as about 10 Å. Dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 Å to about 100 Å, such as about 10 Å or less. Additionally, any combination of silicon dioxide, silicon oxynitride, and/or high-k materials may also be used for dummy gate dielectric 109.

Dummy gate electrode 111 may comprise a conductive material and may be selected from a group comprising W, Al, Cu, AlCu, W, Ti, TiAlN, TaC, TaCN, TaSiN, Mn, Zr, TiN, Ta, TaN, Co, Ni, combinations of these, or the like. Dummy gate electrode 111 may be deposited by chemical vapor deposition (CVD), sputter deposition, or other techniques known and used in the art for depositing conductive materials. The thickness of dummy gate electrode 111 may be in the range of about 5 Å to about 200 Å. The top surface of dummy gate electrode 111 may have a non-planar surface, and may be planarized prior to patterning of dummy gate electrode 111 or gate etch. Ions may or may not be introduced into dummy gate electrode 111 at this point. Ions may be introduced, for example, by ion implantation techniques.

Once formed, dummy gate dielectric 109 and dummy gate electrode 111 may be patterned to form a series of stacks 115 over fins 107. Stacks 115 define multiple channel regions located on each side of fins 107 beneath dummy gate dielectric 109. Stacks 115 may be formed by depositing and patterning a gate mask (not separately illustrated in FIG. 1) on dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. Dummy gate electrode 111 and dummy gate dielectric 109 may be etched using a dry etching process to form patterned stacks 115.

Once stacks 115 have been patterned, first spacers 113 may be formed. First spacers 113 may be formed on opposing sides of stacks 115. First spacers 113 may be formed by blanket depositing a spacer layer (not separately illustrated in FIG. 1) on the previously formed structure. The spacer layer may comprise SiN, oxynitride, SiC, SiON, SiOCN, SiOC, oxide, or the like and may be formed by methods utilized to form such a layer, such as chemical vapor deposition (CVD), plasma enhanced CVD (PECVD), sputter, and other methods known in the art. The spacer layer may comprise a different material with different etch characteristics or the same material as the dielectric material within first isolation regions 105. First spacers 113 may then be patterned, such as by one or more etches to remove the spacer layer from horizontal surfaces of the structure, to form first spacers 113.

In an embodiment, first spacers 113 may be formed to have a first thickness $T_1$ of between about 5 Å and about 500 Å. Additionally, once first spacers 113 have been formed, a first spacer 113 adjacent to one stack 115 may be separated from a first spacer 113 adjacent to another stack 115 by a first distance $D_1$. However, any suitable thicknesses and distances may be alternatively, conjunctively, or sequentially utilized.

Figure 2:
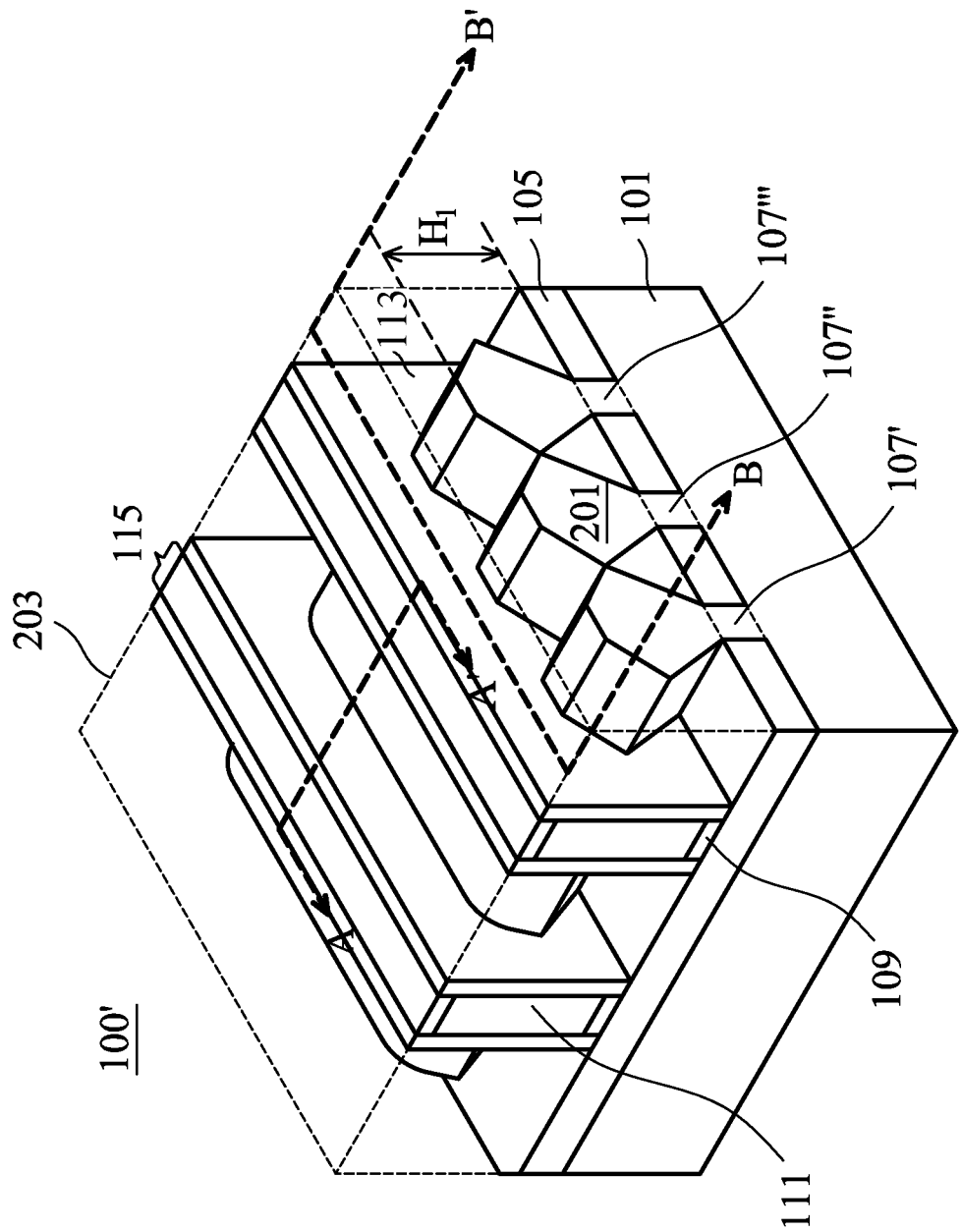
FIG. 2 representatively illustrates formation of source/drain regions, in accordance with some embodiments.
Figure 2A:
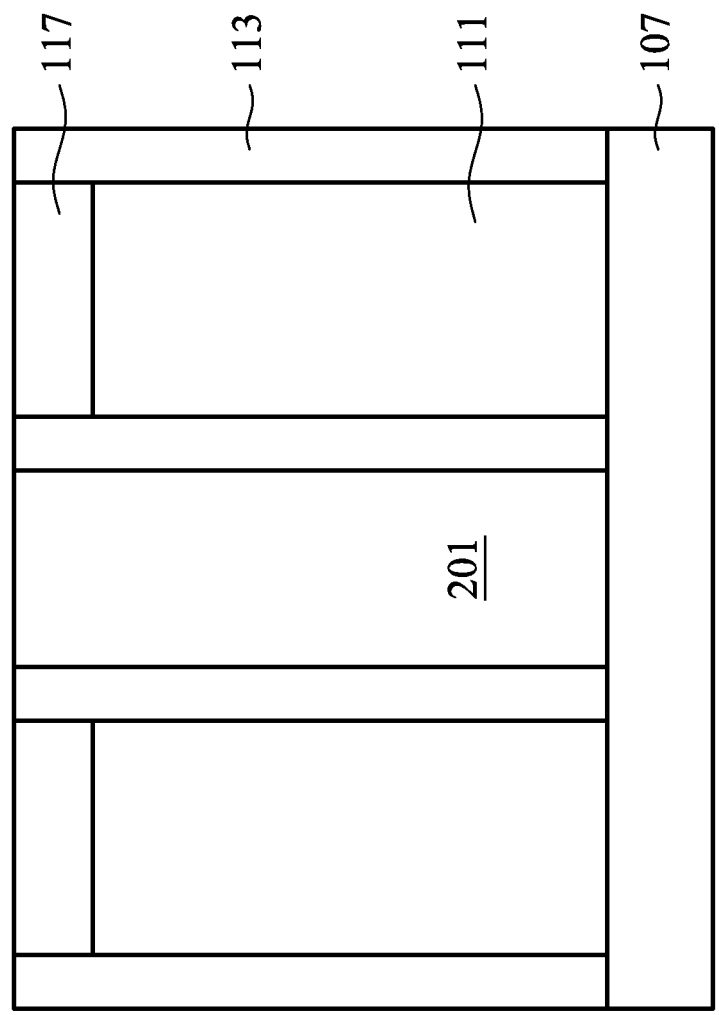
FIGS. 2A and 2B illustrate cross-section views of the structure illustrated in FIG. 2, in accordance with some embodiments.
Figure 2B:
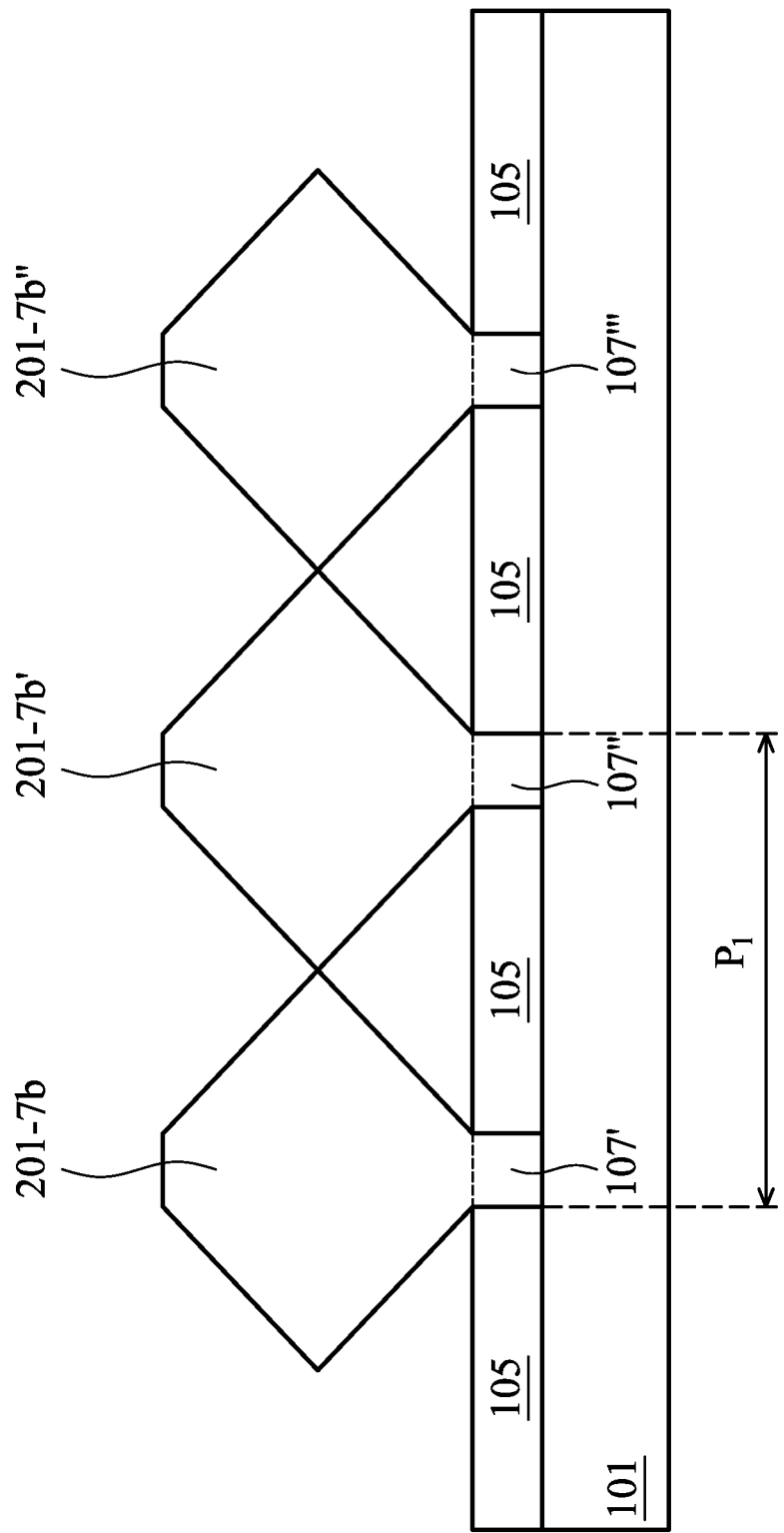

FIGS. 2, 2A and 2B illustrate removal of fins 107 from those areas not protected by stacks 115 and first spacers 113, and a regrowth of source/drain regions 201 (with FIG. 2A illustrating a cross-sectional view of FIG. 2 along line A-A' and FIG. 2B illustrating a cross-sectional view of FIG. 2 along line B'-B'). Removal of fins 107 from areas not protected by stacks 115 and first spacers 113 may be performed by a reactive ion etch (RIE) using stacks 115 and first spacers 113 as hardmasks, or by any other suitable removal process. The removal may be continued until fins 107 are either substantially planar with (as illustrated) or below the surface of first isolation regions 105. Although recessing of fins 107 is representatively illustrated in FIG. 2 with upper surfaces of recessed fin portions 107', 107'', 107''' at substantially a same level as the upper surface of first isolation region 105, it will be appreciated that fins 107 may be recessed below the upper surface of first isolation region 105, or even below the bottom surface of first isolation region 105, in other embodiments.

Once portions of fins 107 have been removed, a hard mask (not separately illustrated in the Figures) is placed and patterned to cover dummy gate electrode 111 to prevent growth, and source/drain regions 201 may be regrown in contact with each of fins 107. In an embodiment, source/drain regions 201 may be regrown and, in some embodiments, source/drain regions 201 may be regrown to form a stressor that will impart a stress to channel regions of fins 107 located underneath stacks 115. In an embodiment wherein fins 107 comprise silicon and the FinFET is a p-type device, source/drain regions 201 may be regrown through a selective epitaxial process with a material, e.g., silicon or a material such as silicon germanium that has a different lattice constant than material of the channel regions. The epitaxial growth process may use precursors such as silane, dichlorosilane, germane, or the like at a temperature of between about 400° C. and about 1000° C., such as about 600° C. and at a pressure of between about 5 Torr and about 1000 Torr. However, any suitable process parameters may be utilized.

In a particular embodiment in which the fin portions 107, 107', and 107'' have a first pitch $P_1$ of about 30 nm, the epitaxial growth is maintained for a time of between about 20 and about 25 minutes in order to obtain epitaxial structures 201-7b, 201-7b', 201-7b'' which are discrete epitaxial structures that are laterally adjoined to each other. That is to say that epitaxial structure 201-7b has a lateral extent contacting a first lateral extent of epitaxial structure 201-7b', and epitaxial structure 201-7b'' also has a lateral extent contacting an opposing second lateral extent of epitaxial structure 201-7b''. However, any suitable time may be utilized.

In an embodiment, source/drain regions 201 may be formed to have a first height $H_1$ over first isolation regions 105. In such an embodiment, source/drain regions 201 may be formed to have a height above the upper surface of first isolation regions 105 of between about 5 nm and about 250 nm, such as about 100 nm. However, any suitable height may be utilized.

Once source/drain regions 201 are formed, dopants may be implanted into source/drain regions 201 by implanting appropriate dopants to complement dopants in fins 107. For example, p-type dopants such as boron, gallium, indium, or the like may be implanted to form a PMOS device. Alternatively, n-type dopants such as phosphorous, arsenic, antimony, or the like may be implanted to form an NMOS device. The dopants may be implanted using stacks 115 and first spacers 113 as masks. It should be noted that one of ordinary skill in the art will appreciate that many other processes, steps, or the like may be used to implant dopants. For example, one of ordinary skill in the art will realize that plural implants may be performed using various combinations of spacers and liners to form source/drain regions having a specific shape or characteristic suitable for a particular purpose. Any such processes may be used to implant the dopants, and the above description is not meant to limit the disclosure to only steps described above.

Additionally, at this point, the hard mask that covered dummy gate electrode 111 during formation of source/drain regions 201 is removed. In a representative embodiment, the hard mask may be removed using, e.g., a wet or dry etching process selective to material of the hard mask; however, any suitable removal process may be utilized.

Figure 3A:
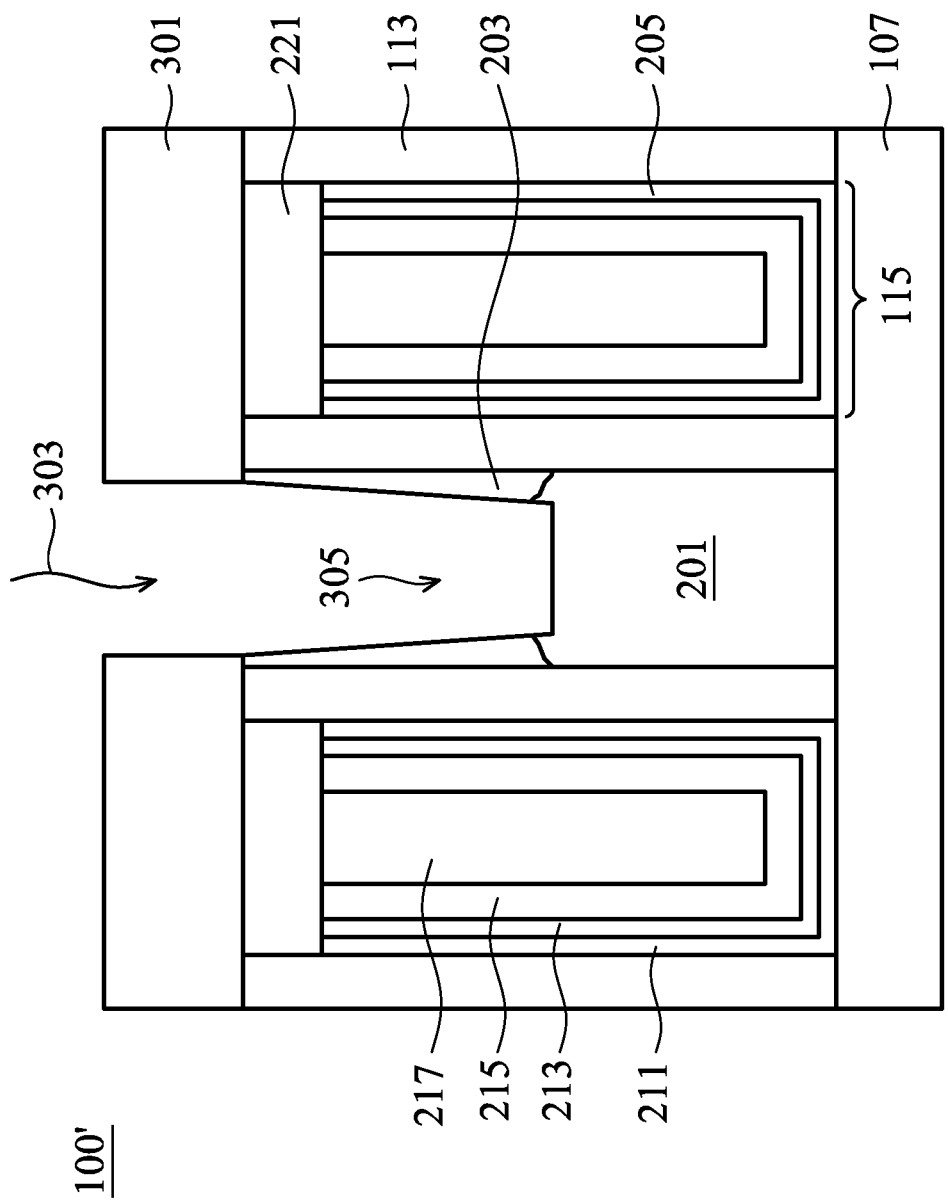
FIGS. 3A-3C illustrates elevation views along the A-A' cross-section representatively illustrating formation of a first opening, in accordance with some embodiments.
Figure 3B:
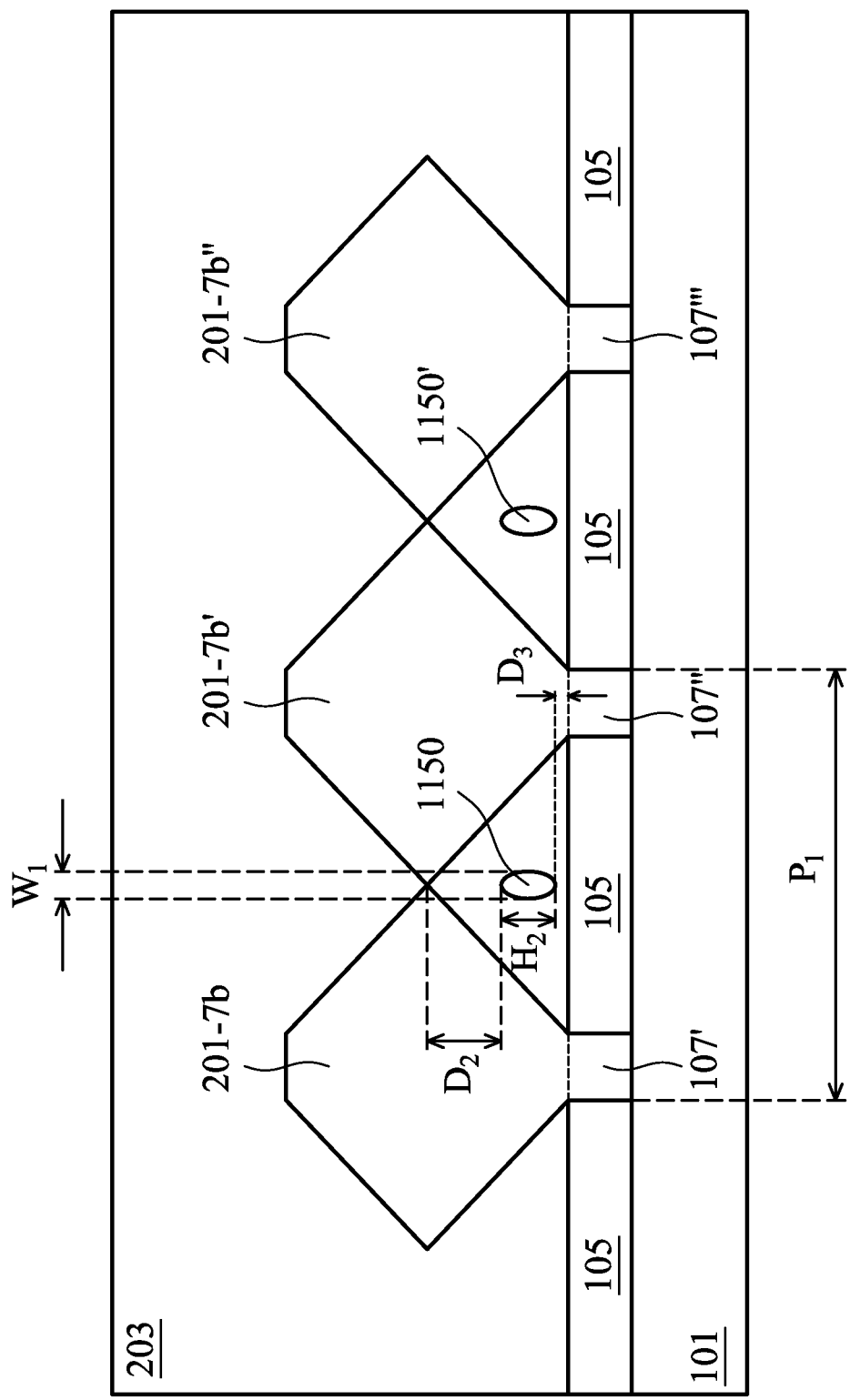

FIGS. 3A and 3B illustrate formation of inter-layer dielectric (ILD) layer 203 (also illustrated in dashed lines in FIG. 2 for clarity) over stacks 115 and source/drain regions 201. ILD layer 203 may comprise a material such as boron phosphorous silicate glass (BPSG), although any suitable dielectric material or combination of materials may be used.

ILD layer 203 may be formed to a thickness of between about 100 Å and about 3,000 Å. Once formed, ILD layer 203 may be planarized with first spacers 113 using, e.g., a planarization process such as chemical mechanical polishing (CMP) process, although any suitable process may be utilized.

In a particular embodiment the ILD 203 may be formed using a deposition process such as low pressure chemical vapor deposition (LPCVD), plasma-CVD, flowable CVD, PVD, PECVD, or the like, at a temperature of between about 50° C. and about 300° C. and a pressure of between about 0.5 torr and about 760 torr. Additionally, the deposition process may be performed for a time of between about 100 seconds and about 800, such as between about 500 seconds and about 800 seconds. However, any suitable deposition process conditions may be utilized.

By depositing the ILD 203 with these deposition parameters, and given the shape of the source/drain regions 201, void regions 1150 and 1150' are formed within the material of ILD 203 underlying epitaxial structures 201-7b, 201-7b', 201-7b". In an embodiment the void regions 1150, 1150' will have a second height $H_2$ of between about 8 nm and about 15 nm and a first width $W_1$ of between about 9 nm and about 10 nm. However, any suitable dimensions may be utilized.

Additionally, the void regions 1150, 1150' may be formed such that the void regions 1150, 1150' are separated from both the epitaxial structures 201-7b, 201-7b', 201-7b" as well as the first isolation regions 105. For example, in some embodiments the void regions 1150, 1150' may be spaced apart from the point of contact between epitaxial structures 201-7b, 201-7b', 201-7b" (in a direction perpendicular to a major surface of the substrate 101) a second distance $D_2$ of between about 5 nm and about 30 nm, such as about 15 nm. Similarly, the void regions 1150, 1150' may be spaced apart from the first isolation regions 105 a third distance $D_3$ of between about 2 nm and about 20 nm, such as about 5 nm. As such, a ratio between the second distance $D_2$ and the third distance $D_3$ may be between about 5 and about 15, such as about 3. However, any suitable distances and ratios may be utilized.

Figure 3C:
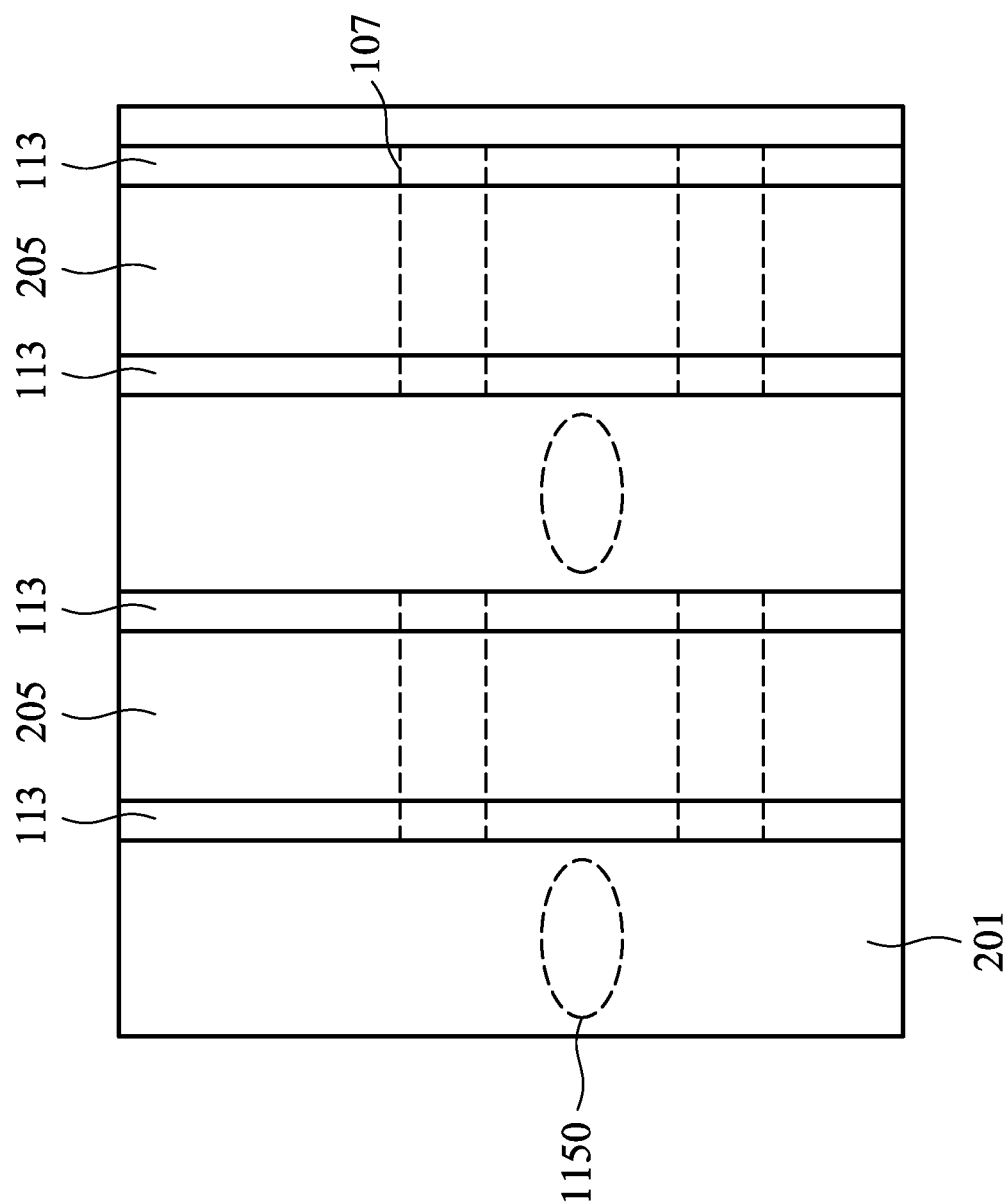

FIG. 3C illustrates a top down view of the structure of FIGS. 3A and 3B. As can be seen, void regions 1150, 1150' (shown in dashed because source/drain regions 201 overlie void regions 1150, 1150') are located between different ones of the gate stacks 205 and their respective first spacers 113. In particular, void regions 1150, 1150' are located within the source/drain regions 201 over the first isolation regions 105 (not separately illustrated in FIG. 3C).

FIG. 3A also illustrates formation of a first opening 305 through ILD layer 203 in order to expose source/drain regions 201 in preparation for formation of a first contact 401 (not illustrated in FIG. 3A, but illustrated and described below with respect to FIG. 4). Additionally, for convenience, gate stack 205 is illustrated in a simplified form without showing component layers thereof. In an embodiment, first opening 305 may be formed by initially placing and patterning hardmask 301 over source/drain regions 201. In an embodiment, hardmask 301 may comprise a dielectric material, such as silicon nitride, although any suitable masking material may be utilized.

Once hardmask 301 has been placed, hardmask 301 is patterned. In an embodiment, a first photoresist may be patterned by depositing and then exposing a photosensitive material onto the hardmask 301. The impact of the energy will cause a chemical reaction in those parts of the photosensitive material that were exposed to the patterned energy source, thereby modifying physical properties of exposed portions of the photoresist, such that physical properties of the exposed portions of the photosensitive material are different from physical properties of the unexposed portions of photosensitive material. The photosensitive material may then be developed with, e.g., a developer (not separately illustrated in the Figures), in order to separate exposed portions of photosensitive material from unexposed portions of photosensitive material. Thereafter, hardmask 301 may be patterned using an anisotropic etch with the exposed portions of photosensitive material serving as a mask.

Once hardmask 301 has been patterned, first opening 305 may be formed using hardmask 301 as a mask. In an embodiment, first opening 305 may be formed using a first etching process (represented in FIG. 3 by the curvilinear arrow labeled 303), which may be an anisotropic etching process, such as a reactive ion etch process; however, any suitable process, such as a wet etching process, and any suitable reactants may be used.

First etching process 303 may be utilized to form first opening 305 in preparation for formation of first contact 401. In a particular embodiment, first etching process 303 may be utilized to remove material of source/drain region 201 to a distance sufficient to expose the source/drain region 201. However, any suitable depth may be utilized. Additionally, first opening 305 at a point adjacent to a top of first spacer 113 may have a width (from hardmask 301) of between about 10 nm and about 50 nm, and may also have a width at a bottom of the first opening 305 of between about 8 nm and about 40 nm; however, any suitable dimensions may be utilized.

Once first opening 305 has been formed, hardmask 301 may be removed. In an embodiment, hardmask 301 may be removed using, e.g., a wet or dry etching process that employs an etchant selective to material of hardmask 301; however, any suitable removal process may also be utilized.

FIG. 3A also illustrates that, after formation of ILD layer 203, material of dummy gate electrode 111 may be removed and replaced to form gate stack 205. In a representative embodiment, dummy gate electrode 111 may be removed using, e.g., a wet or dry etching process that employs etchants selective to material of dummy gate electrode 111. However, any suitable removal process may be utilized.

Once dummy gate electrode 111 has been removed, openings left behind may be refilled to form gate stack 205. In a particular embodiment, gate stack 205 comprises a first dielectric material 211, a first metal material 213, a second metal material 215, and a third metal material 217. In an embodiment, first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition (ALD), chemical vapor deposition (CVD), or the like. First dielectric material 211 may be deposited to a thickness of between about 5 Å and about 200 Å. Any suitable material, material deposition process, or material thickness may be utilized.

First metal material 213 may be formed adjacent to first dielectric material 211 and may be formed from a metallic material such as Ti, TiAlN, TaC, TaCN, TaSiN, Mn, Zr, TiN, TaN, Ru, Mo, WN, combinations of these, or the like. First metal material 213 may be deposited using a deposition process such as atomic layer deposition (ALD), chemical vapor deposition (CVD), sputtering, or the like, to a thickness of between about 5 Å and about 500 Å, although any suitable deposition process or thickness may be used.

Second metal material 215 may be formed adjacent to first metal material 213 and, in a particular embodiment, may be similar to first metal material 213. For example, second metal material 215 may be formed from a metallic material such as Ti, TiAlN, TaC, TaCN, TaSiN, Mn, Zr, TiN, TaN, Ru, Mo, WN, combinations of these, or the like. Additionally, second metal material 215 may be deposited using a deposition process such as atomic layer deposition (ALD), chemical vapor deposition (CVD), sputtering, or the like, to a thickness of between about 5 Å and about 500 Å, although any suitable deposition process or thickness may be used.

Third metal material 217 fills a remainder of the opening left behind by removal of dummy gate electrode 111. In an embodiment, third metal material 217 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition (ALD), chemical vapor deposition (CVD), sputtering, or the like to fill or overfill the opening left by removal of dummy gate electrode 111. In a particular embodiment, third metal material 217 may be deposited to a thickness of between about 5 Å and about 500 Å, although any suitable material, deposition process, or material thickness may be utilized.

Once the opening left behind by the removal of dummy gate electrode 111 has been filled, the materials may be planarized in order to remove any material that is outside of the opening left behind by the removal of dummy gate electrode 111. In a particular embodiment, removal may be performed using a planarization process such as chemical mechanical polishing (CMP); however, any suitable planarization or other removal process may be utilized.

After materials of gate stack 205 have been formed and planarized, materials of gate stack 205 may be recessed and capped with a capping layer 221. In an embodiment, materials of gate stack 205 may be recessed using, e.g., a wet or dry etching process that employs etchants selective to materials of gate stack 205. Any suitable recession process or recession distance may be utilized.

Once materials of gate stack 205 have been recessed, capping layer 221 may be deposited and planarized with first spacers 113. In an embodiment, capping layer 221 comprises a material such as SiN, SiON, SiCON, SiC, SiOC, combinations of these, or the like, deposited using a deposition process such as atomic layer deposition (ALD), chemical vapor deposition (CVD), sputtering, or the like. Capping layer 221 may be deposited to a thickness of between about 5 Å and about 200 Å, and then planarized using a planarization process such as chemical mechanical polishing (CMP) such that capping layer 221 is substantially planar with first spacers 113.

Figure 4:
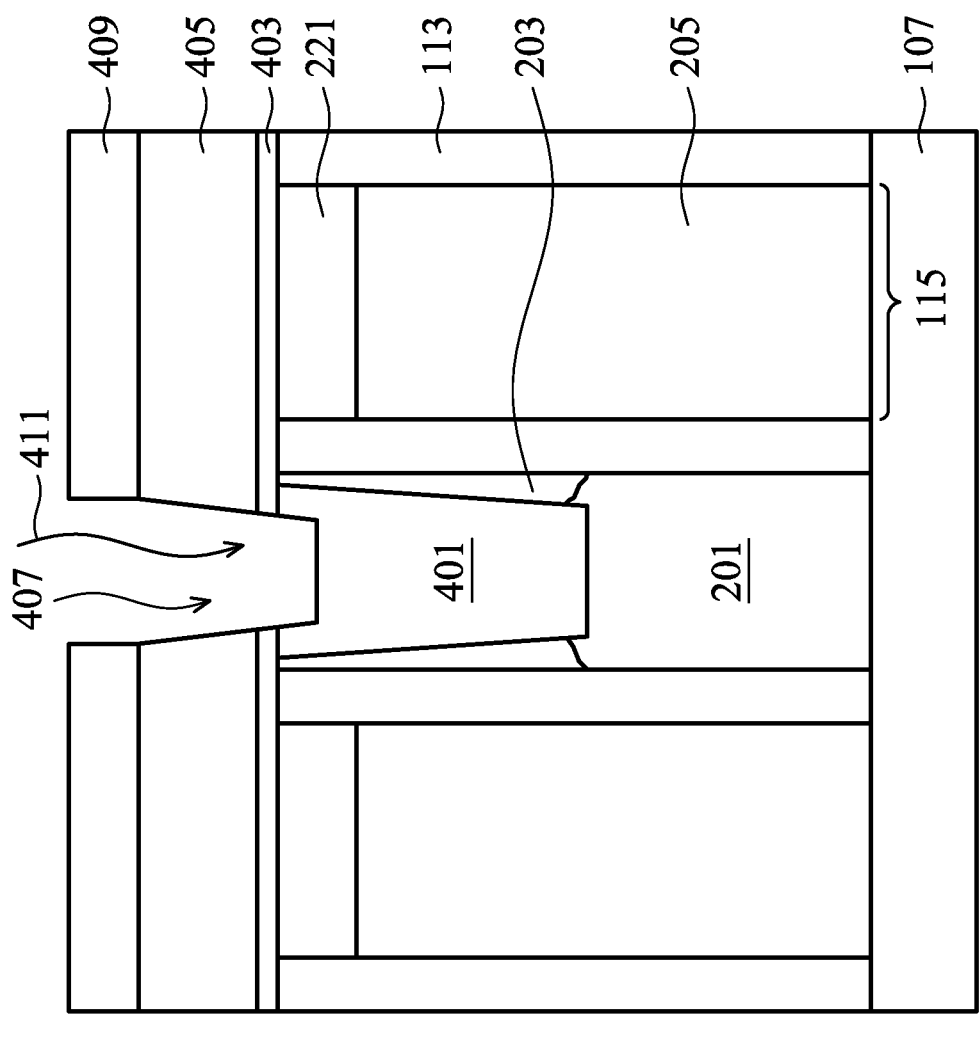
FIG. 4 is an elevation view along the A-A' cross-section representatively illustrating formation of a second opening in a first source/drain contact feature, in accordance with some embodiments.

FIG. 4 illustrates a formation of first contact 401 as well as formation of first etch stop layer 403 and first dielectric layer 405. Optionally, prior to formation of first contact 401, a silicide contact may be formed. The silicide contact may comprise titanium, nickel, cobalt, or erbium in order to reduce a Schottky barrier height of the contact; however, other metals, such as platinum, palladium, or the like, may also be used. The silicidation may be performed by blanket deposition of an appropriate metal layer, followed by an annealing step which causes the metal to react with underlying exposed silicon. Un-reacted metal is then removed, such as with a selective etch process. The thickness of the silicide contact may be between about 5 nm and about 50 nm.

In a representative embodiment, first contact 401 may comprise a conductive material such as Ti, W, TiAlN, TaC, TaCN, TaSiN, Mn, Zr, TiN, TaN, Ru, Mo, or WN, although any suitable material, such as aluminum, copper, alloys of these, combinations of these, or the like may be used. Conductive material may be deposited into first opening 305 using a deposition process such as sputtering, chemical vapor deposition (CVD), electroplating, electroless plating, or the like, to fill and/or overfill first opening 305 formed by first etching process 303. Once filled (or overfilled), any material deposited outside of first opening 305 may be removed using a planarization process such as chemical mechanical polishing (CMP); however, any suitable material removal process may be utilized.

In a representative embodiment, first etch stop layer 403 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 403, such as low pressure CVD (LPCVD), PVD, or the like, could alternatively be used. First etch stop layer 403 may have a thickness of between about 5 Å and about 500 Å.

Once first etch stop layer 403 has been formed, first dielectric layer 405 is formed. First dielectric layer 405 may be made of one or more suitable dielectric materials, such as low-k dielectrics (e.g., carbon doped oxides), extremely low-k dielectrics (e.g., porous carbon doped silicon dioxide), silicon oxide, silicon nitride, a polymer (e.g., polyimide), combinations of these, or the like. First dielectric layer 405 may be formed through a process such as a spin-on process or a chemical vapor deposition (CVD), although any suitable process may be utilized.

FIG. 4 also illustrates a patterning of both first dielectric layer 405 and first etch stop layer 403 to form second opening 407 that exposes first contact 401. In a representative embodiment, first dielectric layer 405 and first etch stop layer 403 may be patterned by initially placing and patterning second photoresist 409 over first dielectric layer 405. In an embodiment, second photoresist 409 may be a tri-layer photoresist that is exposed with a patterned energy in order to pattern second photoresist 409. Second photoresist 409 may then be developed and etched to pattern second photoresist 409.

Once second photoresist 409 has been patterned, the pattern of second photoresist 409 may be transferred to first dielectric layer 405 and first etch stop layer 403 using second photoresist 409 as a mask. In an embodiment, first dielectric layer 405 may be patterned using a second etching process (represented in FIG. 4 by the curvilinear arrow labeled 411), which may be an anisotropic etching process, such as a reactive ion etch process; however, any suitable process, such as a wet etching process, and any suitable reactants may be used.

Second etching process 411 may be utilized to remove material of first dielectric layer 405 to form second opening 407 in preparation of formation of second contact 501 (not illustrated in FIG. 4, but illustrated and discussed below with respect to FIG. 5). In a particular embodiment, second etching process 411 may be utilized to remove material of first dielectric layer 405 until first etch stop layer 403 is exposed; however, any suitable process of removal, such as a wet etch, may be utilized.

Once first etch stop layer 403 has been exposed, the pattern of first dielectric layer 405 may be transferred through first etch stop layer 403 to expose first contact 401. In a representative embodiment, the pattern may be transferred using, e.g., an anisotropic etch process, such as a reactive ion etch, that uses etchants selective to material of first etch stop layer 403; however, any suitable etchants or processes, such as a wet etch, may also be utilized. Additionally, after first etch stop layer 403 has been opened to expose underlying first contact 401, the etching may either be stopped without extending into first contact 401, or may be continued to slightly over-etch and form second opening 407 to extend partially into first contact 401.

Figure 5:
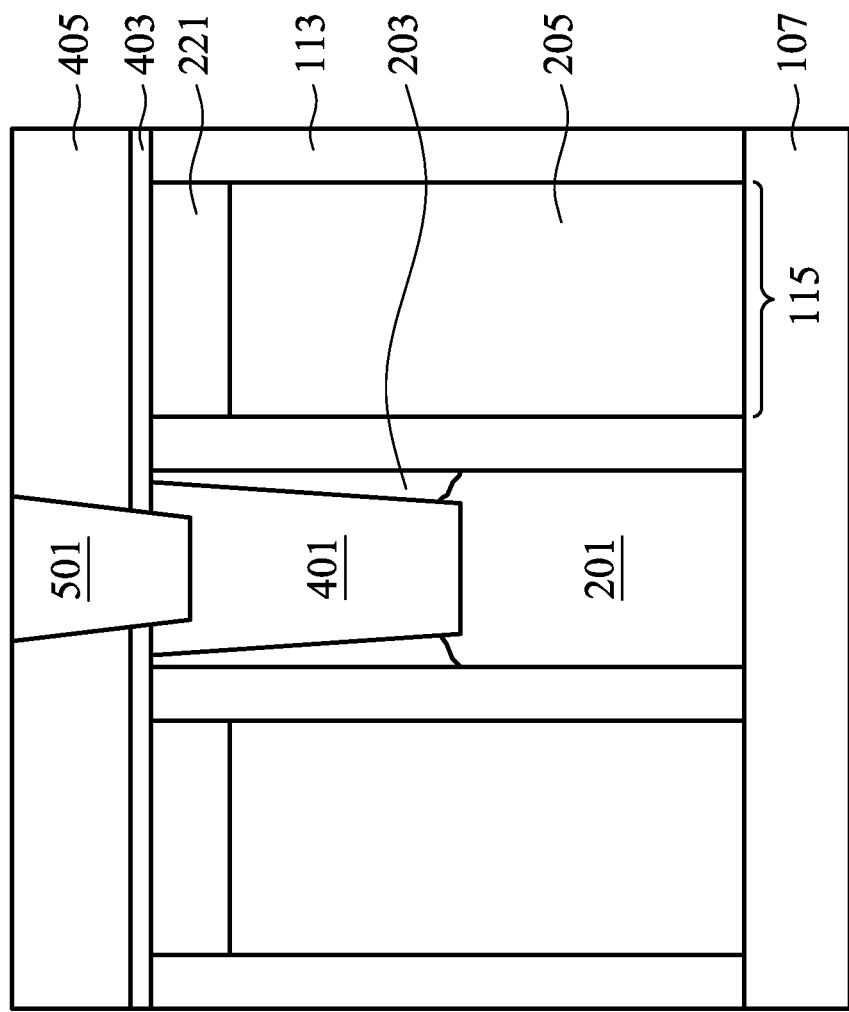
FIG. 5 is an elevation view along the A-A' cross-section representatively illustrating formation of a second source/drain contact feature, in accordance with some embodiments.

FIG. 5 representatively illustrates removal of second photoresist 409, as well as formation of second contact 501. In an embodiment, second photoresist 409 may be removed using, e.g., an ashing process, whereby a temperature of second photoresist 409 is increased until second photoresist 409 undergoes a thermal decomposition, at which point second photoresist 409 may be easily removed; however, any suitable removal process, such as a wet etch, may also be utilized.

After first contact 401 has been exposed, a conductive material may be deposited to fill and/or overfill second opening 407 to make electrical connection with first contact 401. In a representative embodiment, second contact 501 may comprise a conductive material such as tungsten (W), although any suitable material, such as aluminum, copper, alloys of these, combinations of these, or the like, may be alternatively or conjunctively used. The conductive material may be deposited using a deposition process such as sputtering, chemical vapor deposition (CVD), electroplating (with a seed layer), electroless plating, or the like, to fill and/or overfill second opening 407. Once filled or overfilled, any material deposited outside of second opening 407 may be removed using a planarization process such as chemical mechanical polishing (CMP).

Figure 6:
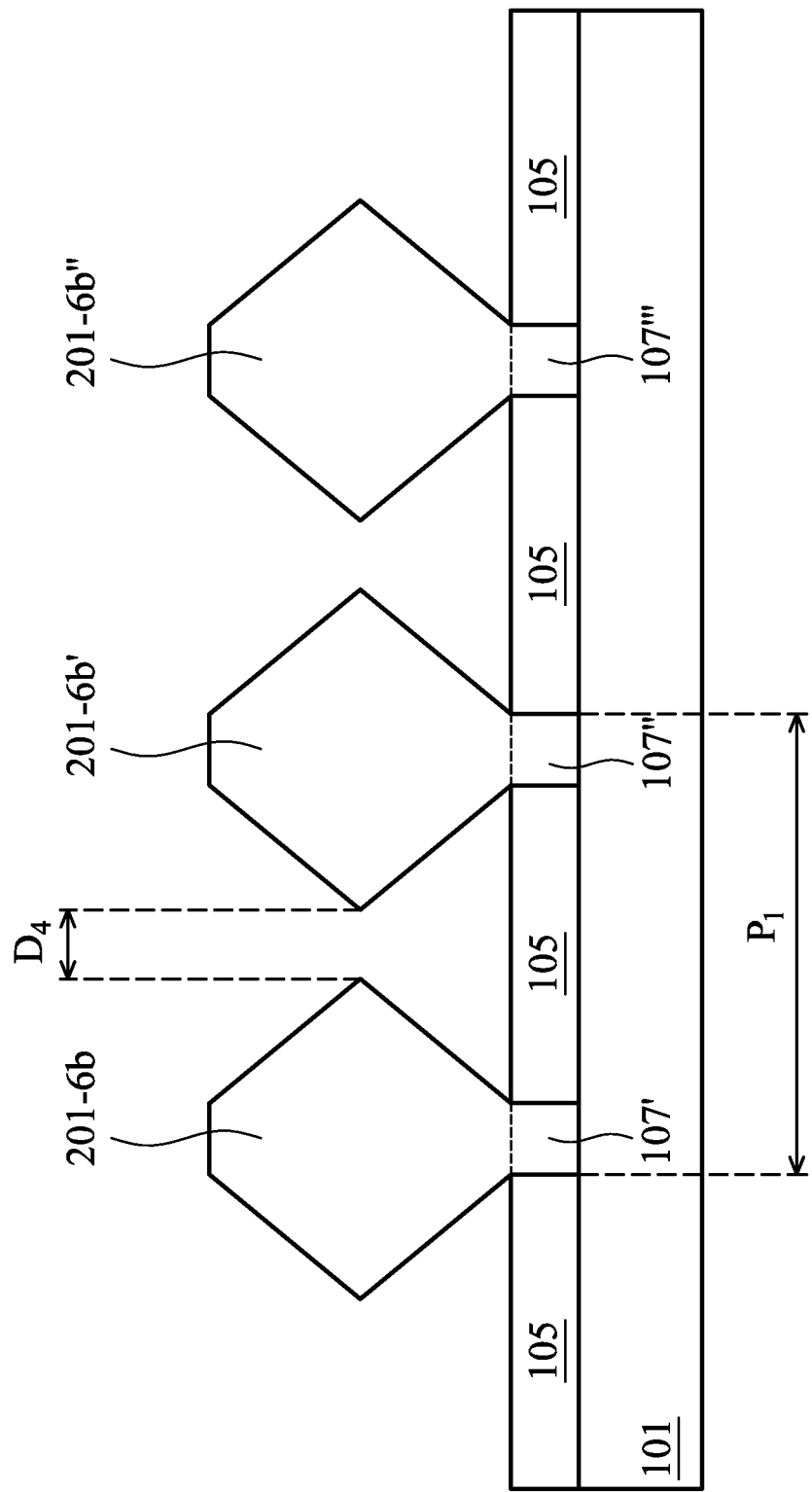
FIGS. 6, 7 and 8 are elevation views along the B-B' cross-section representatively illustrating formation of epitaxial source/drain regions, in accordance with some embodiments.

FIG. 6 illustrates another embodiment of the formation of epitaxial source/drain structures 201-6b, 201-6b', 201-6b" over respective fin portions 107', 107", 107"' if the epitaxial growth process (described above with respect to FIGS. 2, 2A and 2B) is not allowed to proceed for the full amount of time for discrete structures to merge or contact with each other, or if the fin pitch $P_1$ is decreased. In this embodiment, epitaxial structures 201-7b, 201-7b', 201-7b" (as representatively illustrated in FIG. 6) may be formed. If the epitaxial growth process is terminated prior to contacting, (e.g., prior to the time to produce the structure representatively illustrated in FIG. 2B), the epitaxial structures will remain discrete epitaxial structures 201-7b, 201-7b', 201-7b" separated from each other. In a particular embodiment the epitaxial growth process may be continued for a period of time, such as between about 15 minutes and 20 minutes (for about 20-30 cycles) configured to produce substantially discrete epitaxial structures 201-7b, 201-7b', 201-7b" that are spaced apart from each other by a fourth distance $D_4$ of between about 30 nm and about 100 nm. However, any suitable distance may be utilized.

Figure 7:
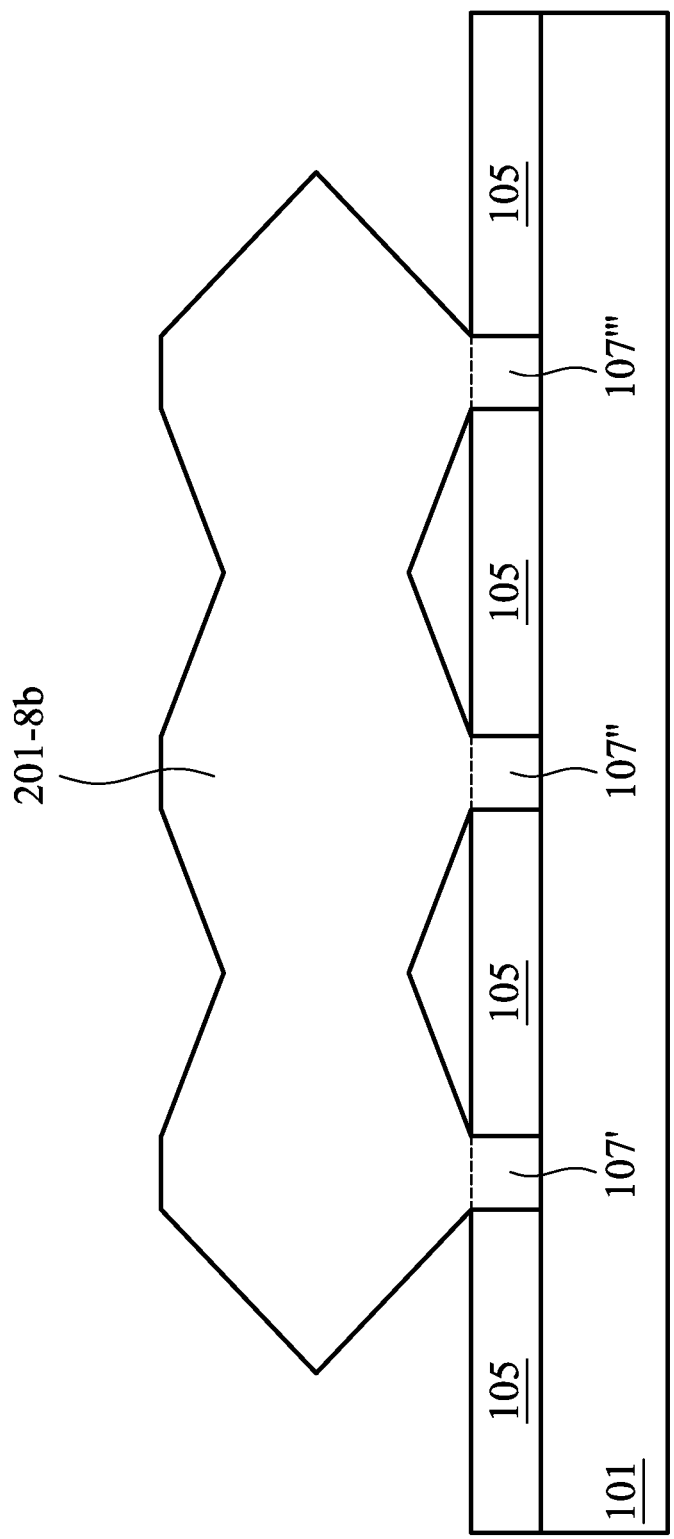

FIG. 7 illustrates yet another embodiment of the formation of epitaxial source/drain structures in which the discrete structures not only come into contact with each other (as described above with respect to FIGS. 2, 2A, and 2B) but merge into a single merged epitaxial structure 201-8b that comprises an upper and/or lower surface having an irregular surface topology in general correspondence to planes of epitaxial growth for the former discrete epitaxial structures initially formed over fin portions 107', 107", 107"'. In a particular embodiment the irregular surface topology may have a surface roughness of between about 2 and about 10 nm, and may be achieved by continuing the deposition process described above for a time of between about 25 minutes and about 30 minutes. However, any suitable time or surface roughness may be utilized.

Figure 8:
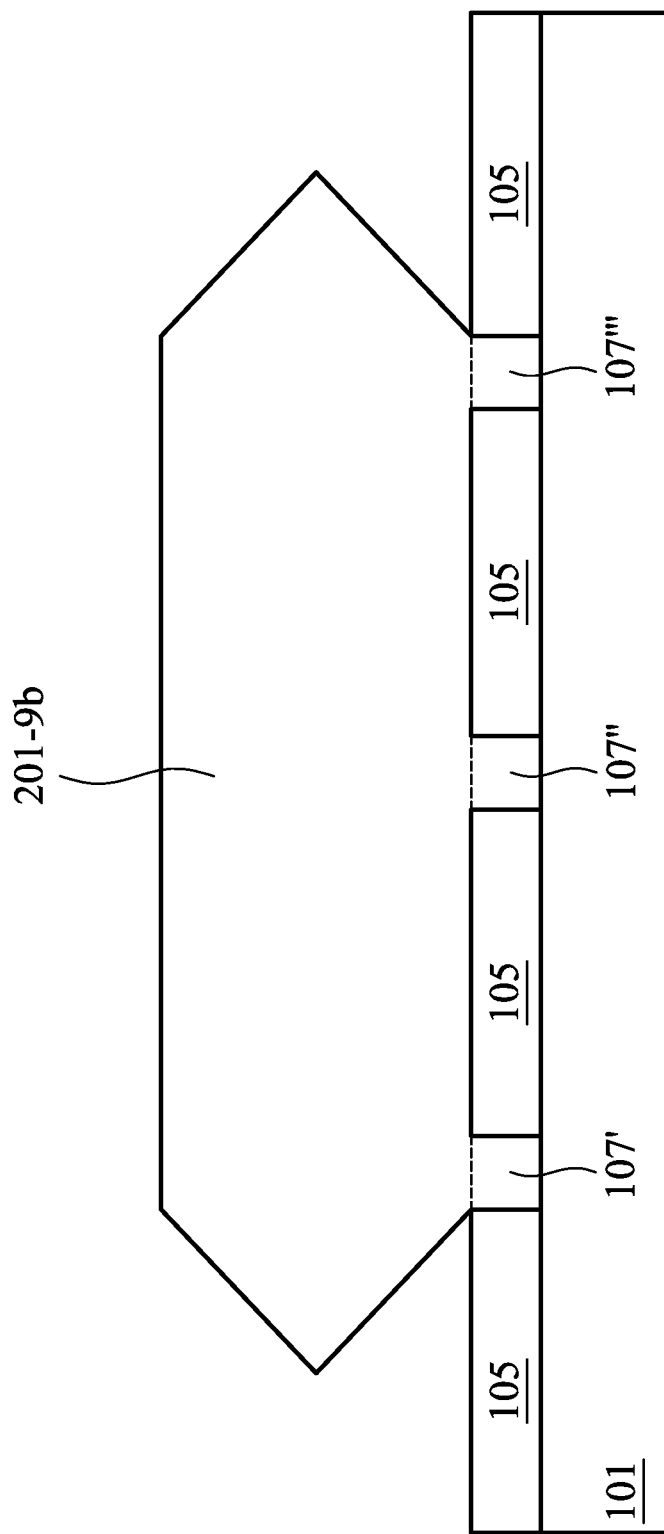

If the epitaxial growth process extends still further in time (e.g., past the time to produce the merged epitaxial structure 201-8b illustrated in FIG. 7 above), the irregular surface topology representatively illustrated in FIG. 7 may be filled in to produce a substantially planar upper and/or lower surface, as representatively illustrated in FIG. 8. Additionally, as used herein, the term "planar" may be generally understood to mean a level of local and/or global surface topography differentials that are generally consistent with process variations—and not that the surface is necessarily flat or even substantially flat.

In a particular embodiment the merged epitaxial structure 201-9b may be formed by continuing the deposition process for a time period of greater than about 30 minutes. Such a time period will form the merged epitaxial structure 201-9b to have a height from the first isolation regions 105 of between about 45 nm and about 60 nm and have a width of between about 60 nm and about 150 nm. Additionally, the planar top surface of the merged epitaxial structure 201-9b may form an angle of less than 30° with an adjoining facet of the merged epitaxial structure 201-9b. However, any suitable time or dimensions may be utilized.

FIGS. 9-17 representatively illustrate embodiments in which the shape of the first isolation region 105 (e.g., shallow trench isolation (STI) features) may be tuned as desired. In embodiments representatively illustrated in FIGS. 9-17, a shape of top surfaces of first isolation region 105 may be tuned to have concave shapes 1000 between fin portions 107', 107", 107"', wherein a distance between adjacent fins comprises the first pitch $P_1$. In a particular embodiment, the concave shape may be obtained during the etching of the first isolation region 105 and fins 107 to expose fin portions 107', 107", 107"' by performing one or more over-etchings of first isolation region 105 after fin portions 107', 107", 107"' have been exposed. For example, the recessing described above with respect to FIG. 1 may be performed, and the etching process may be continued for an additional 30% of the process time originally used for the recessing step. Bu utilizing such an overetching, the first isolation region 105 may be formed with a concave shape that has, for example, a distance of concavity $D_c$ (a distance of the lowest point relative to a planar surface) of between about 1 nm and about 15 nm, such as about 5 nm. However, any suitable concavity may be utilized.

Figure 9:
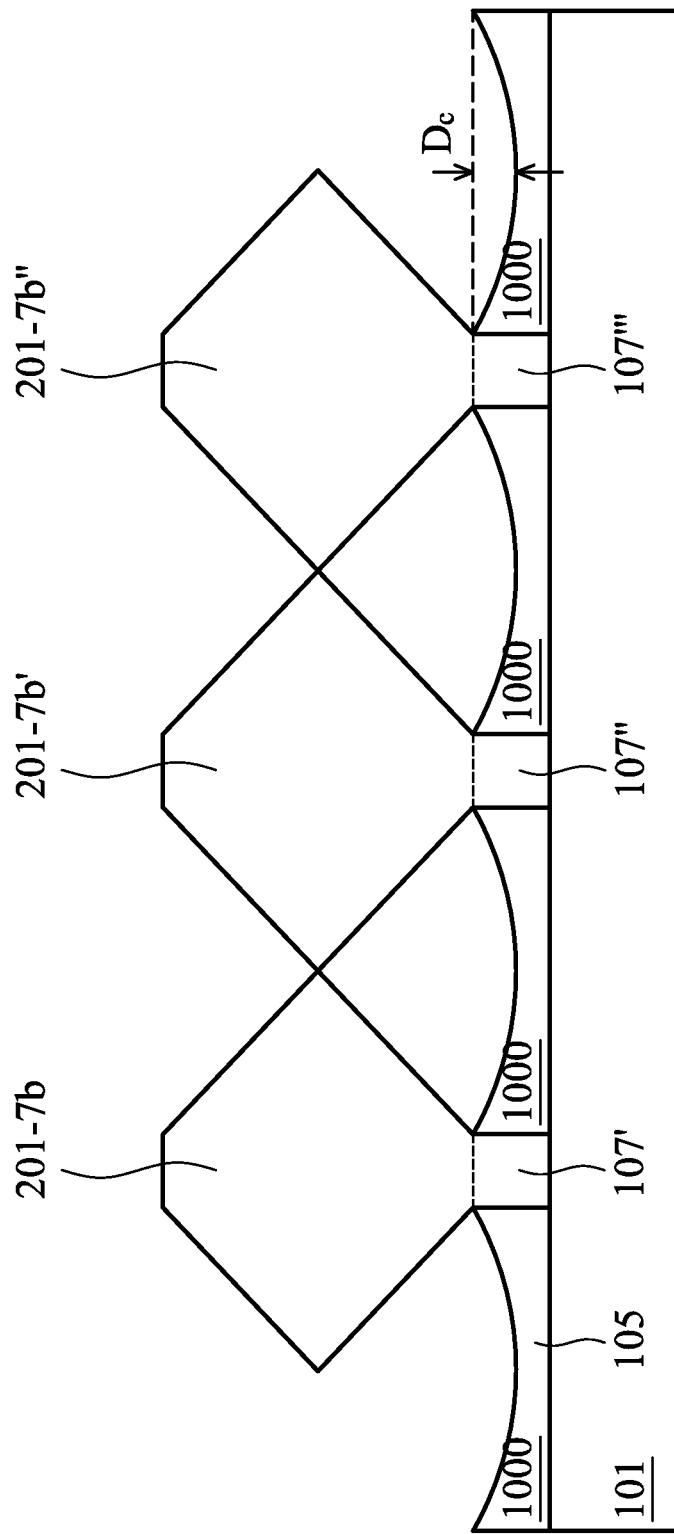
FIG. 9 is an elevation view along the B-B' cross-section representatively illustrated in FIG. 2, in accordance with some embodiments.
Figure 10:
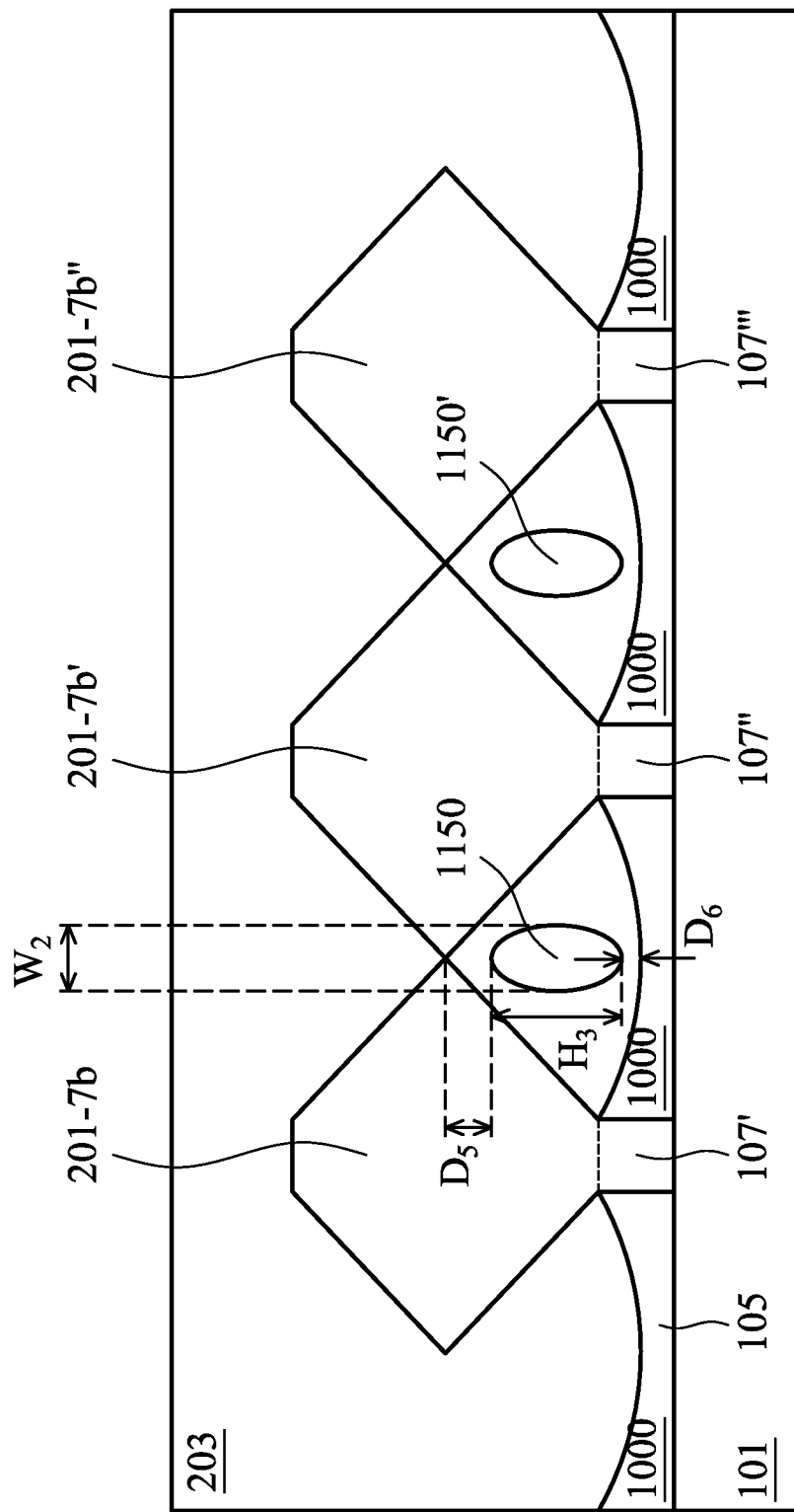
FIGS. 10-18 are elevation views along the B-B' cross-section representatively illustrating formation of epitaxial source/drain regions, in accordance with some embodiments.

FIGS. 9 and 10 representatively illustrate an embodiment where discrete epitaxial structures 201-7b, 201-7b', 201-7b" (in at least nominal contact with each other owing to the duration of epitaxial growth and/or configured fin pitch as described above with respect to FIGS. 2, 2A and 2B) are located over the concave shapes 1000 of the first isolation regions 105 and are encapsulated in the ILD 203. In a particular embodiment the ILD 203 may be formed as described above, including using a deposition process such as low pressure chemical vapor deposition (LPCVD), plasma-CVD, flowable CVD, PVD, PECVD, or the like, at a temperature of between about 50° C. and about 300° C. and a pressure of between about 0.5 torr and about 760 torr. Additionally, the deposition process may be performed for a time of between about 100 seconds and about 800, such as between about 500 seconds and about 800 seconds. Such a deposition process, along with the contacting shape of the epitaxial structures 201-7b, will form the void regions 1150 and 1150' in FIG. 10 to have a third height $H_3$ of between about 8 nm and about 15 nm and a second width $W_2$ of between about 9 nm and about 10 nm. However, any suitable dimensions or process conditions may be utilized.

Additionally, the void regions 1150, 1150' may be formed such that the void regions 1150, 1150' are separated from both the epitaxial structures 201-7b, 201-7b', 201-7b" as well as the first isolation regions 105. For example, in some embodiments the void regions 1150, 1150' may be spaced apart from the point of contact between epitaxial structures 201-7b, 201-7b', 201-7b" (in a direction perpendicular to a major surface of the substrate 101) a fifth distance $D_5$ of between about 2 nm and about 15 nm, such as about 5 nm. Similarly, the void regions 1150, 1150' may be spaced apart from the first isolation regions 105 a sixth distance $D_6$ of between about 1 nm and about 10 nm, such as about 3 nm. As such, a ratio between the fifth distance $D_5$ and the sixth distance $D_6$ may be between about 1 nm and about 10 nm, such as about 5 nm, while a ratio of the sixth distance $D_6$ and the distance of concavity D, is between about 1 and about 15, such as about 2. However, any suitable distances and ratios may be utilized.

Figure 11:
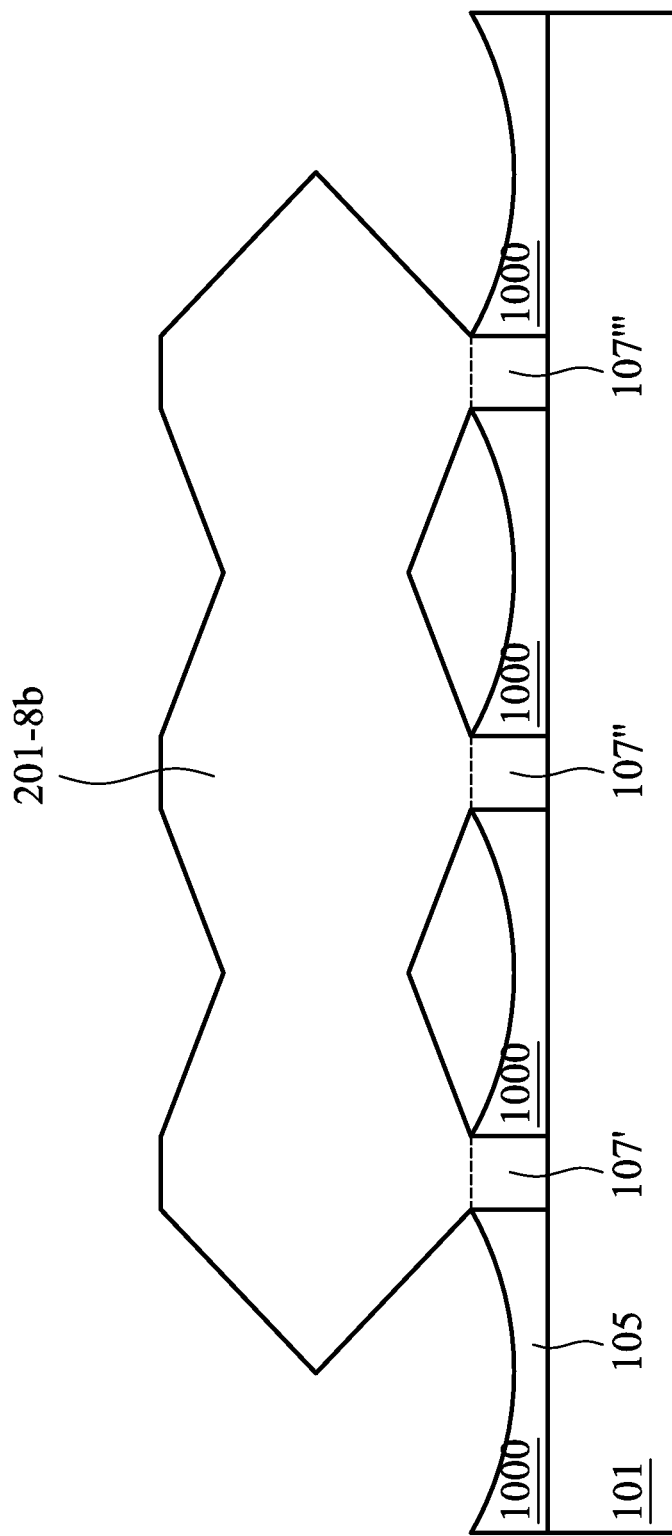
Figure 12:
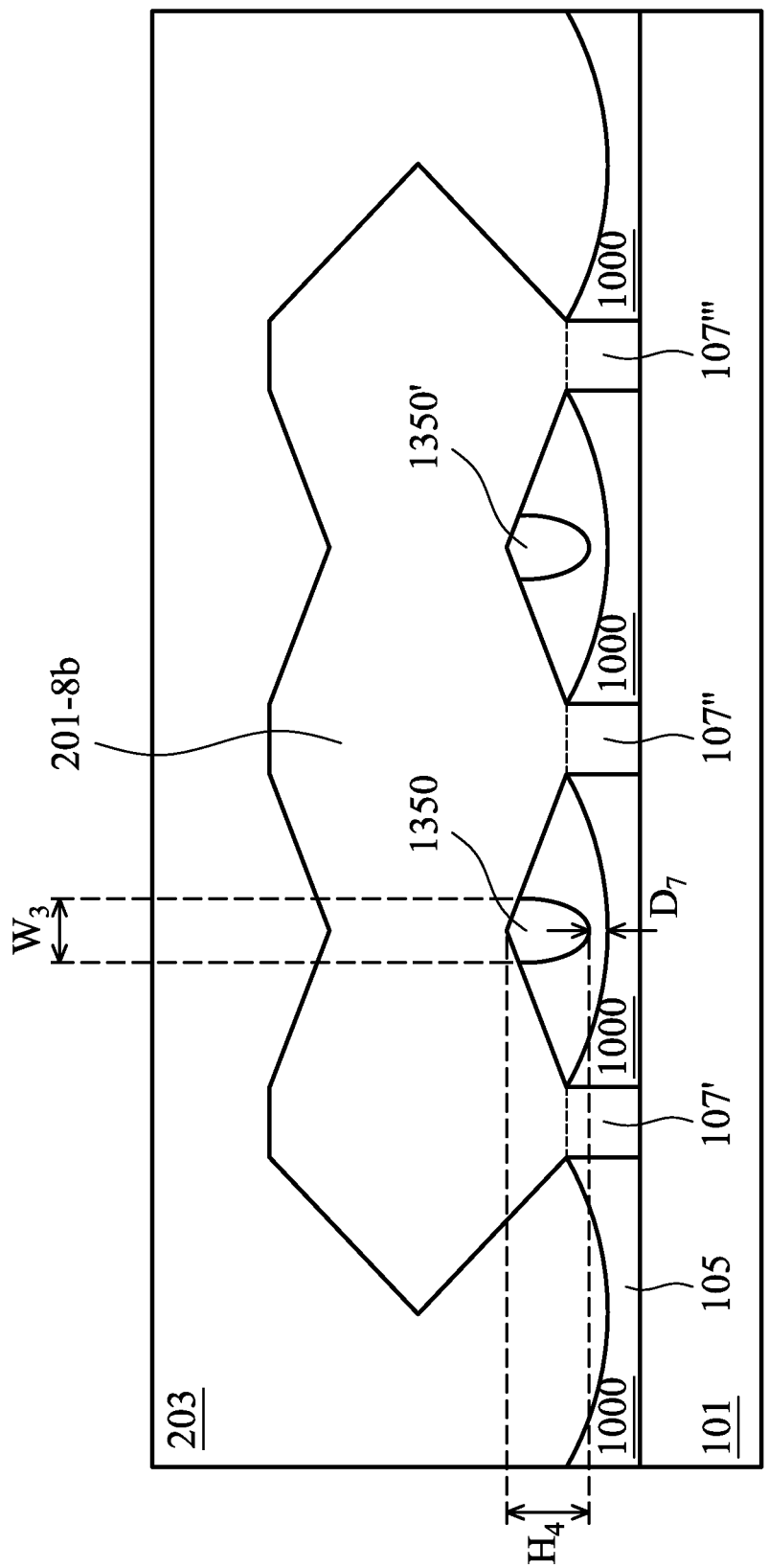

FIGS. 11 and 12 representatively illustrate an embodiment wherein concave first isolation regions 105 and merged epitaxial structure 201-8b (as described above with respect to FIG. 7) are encapsulated in ILD 203. During deposition of ILD 203, void regions 1350, 1350' are formed within ILD 203 and underlying epitaxial structure 201-8b. In a particular embodiment ILD 203 is deposited as described above with respect to FIGS. 3A-3B for a time period of between about 300 seconds and about 500 seconds. Such a deposition process, along with the contacting shape of the source/drain region 201-8b and the concave shape 1000 of the first isolation regions 105, will form the void regions 1350 and 1350' to have a fourth height $H_4$ of between about 8 nm and about 15 nm and a third width $W_3$ of between about 9 nm and about 10 nm. However, any suitable dimensions or process conditions may be utilized.

Additionally, while the void regions 1350, 1350' may be formed such that the void regions 1350, 1350' expose a bottom surface of the epitaxial structure 201-8b, the void regions 1350, 1350' may also be formed to be separated from the first isolation regions 105. For example, in some embodiments the void regions 1350, 1350' may be spaced apart from the first isolation regions 105 a seventh distance $D_7$ of between about 1 nm and about 10 nm, such as about 3 nm. As such, a ratio between the fourth height $H_4$ and the seventh distance $D_7$ may be between about 5 nm and about 20 nm such as about 15 nm while a ratio of the seventh distance $D_7$ and the distance of concavity $D_c$ is between about 1.6 and about 20, such as about 5. However, any suitable distances and ratios may be utilized.

Figure 13:
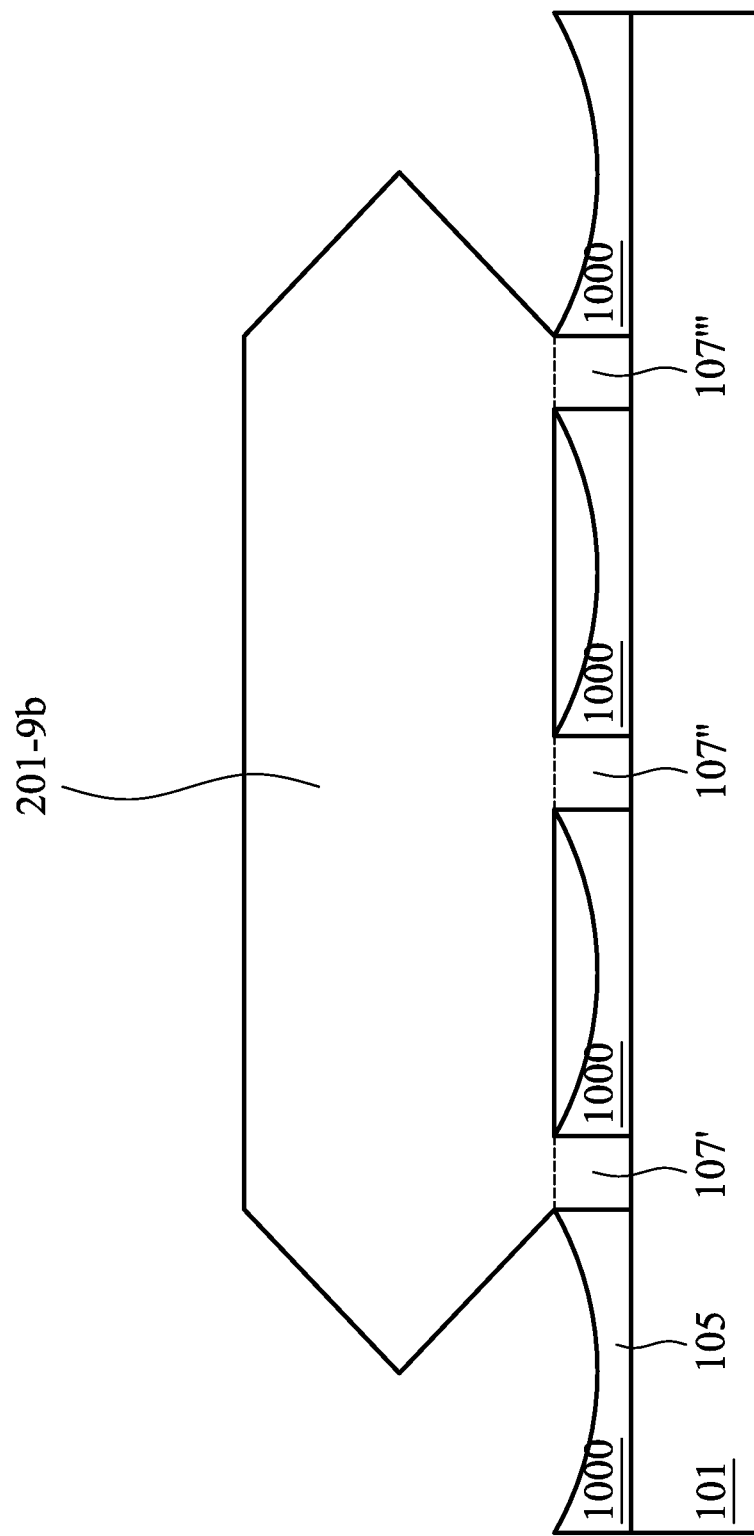
Figure 14:
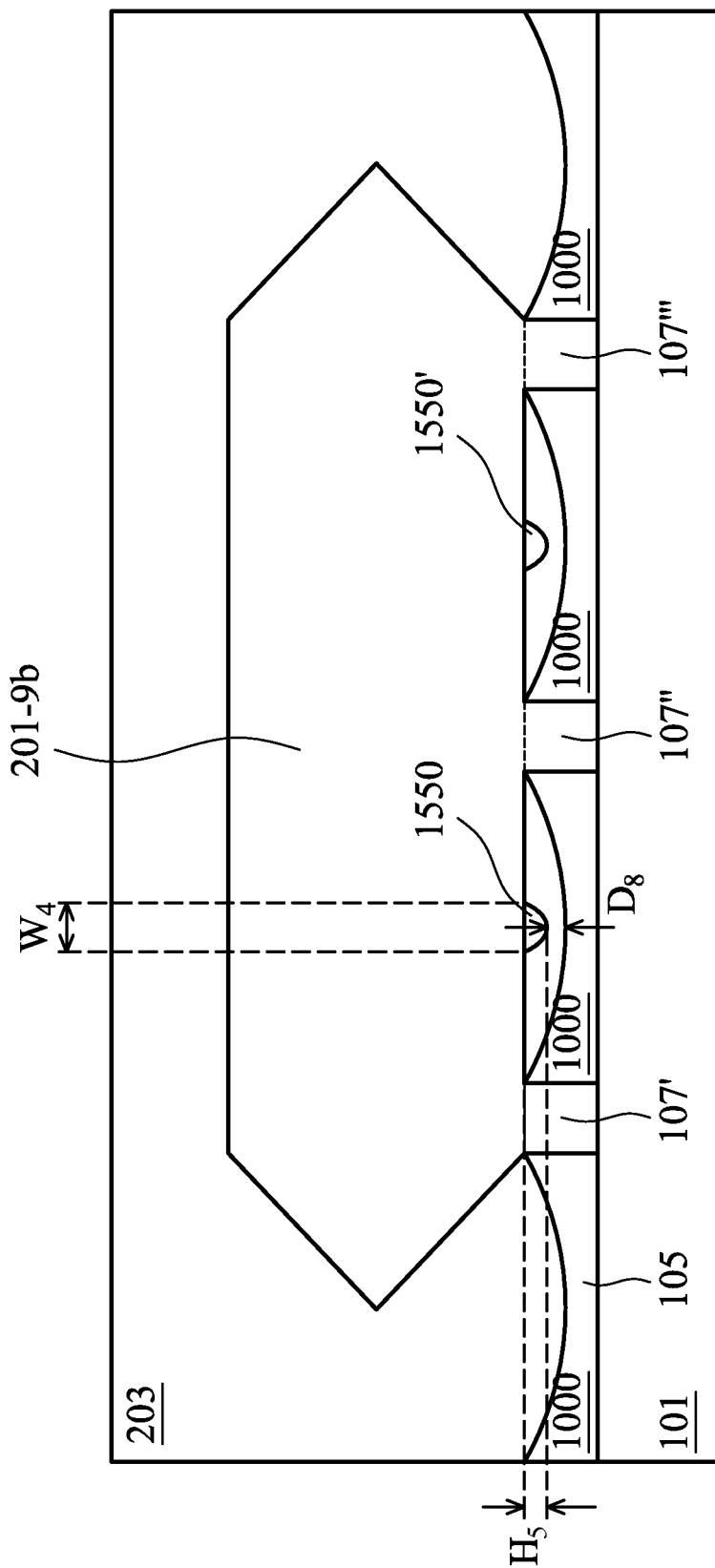

FIGS. 13 and 14 representatively illustrate an embodiment wherein the concave shapes 1000 of the first isolation regions 105 are utilized with the merged epitaxial structure 201-9b when the merged epitaxial structure 201-9b is planar (as described above with respect to FIG. 8) and, in FIG. 14, wherein the merged epitaxial structure 201-9b is encapsulated in ILD 203. In this embodiment the deposition process for the ILD 203 may be continued as described above for a time period of between about 100 seconds and about 300 seconds. However, any suitable time of deposition may be utilized.

By utilizing the deposition and time as described, void regions 1550, 1550' are formed within material forming ILD 203 and underlying epitaxial structure 201-9b. In a particular embodiment, the concave shapes 1000 of the first isolation regions 105 and the planar shape of the merged epitaxial structure 201-9b will form the void regions 1550, 1550' to expose a portion of the underside of the merged epitaxial structure 201-9b, and the void regions 1550, 1550' may have a fourth width $W_4$ of less than about 5 nm and a fifth height $H_5$ of less than about 10 nm. However, any suitable dimensions may be utilized.

Additionally, while the void regions 1550, 1550' may be formed such that the void regions 1550, 1550' expose a bottom surface of the epitaxial structure 201-9b, the void regions 1550, 1550' may also be formed to be separated from the first isolation regions 105. For example, in some embodiments the void regions 1550, 1550' may be spaced apart from the first isolation regions 105 an eighth distance $D_8$ of between about 1 nm and about 10 nm, such as about 4 nm. As such, a ratio between the fifth height $H_5$ and the eighth distance $D_8$ may be between about 0.5 and about 2, such as about 1 while a ratio of the eighth distance $D_8$ and the distance of concavity $D_c$ is between about 0.2 and about 2, such as about 0.8. However, any suitable distances and ratios may be utilized.

Figure 15:
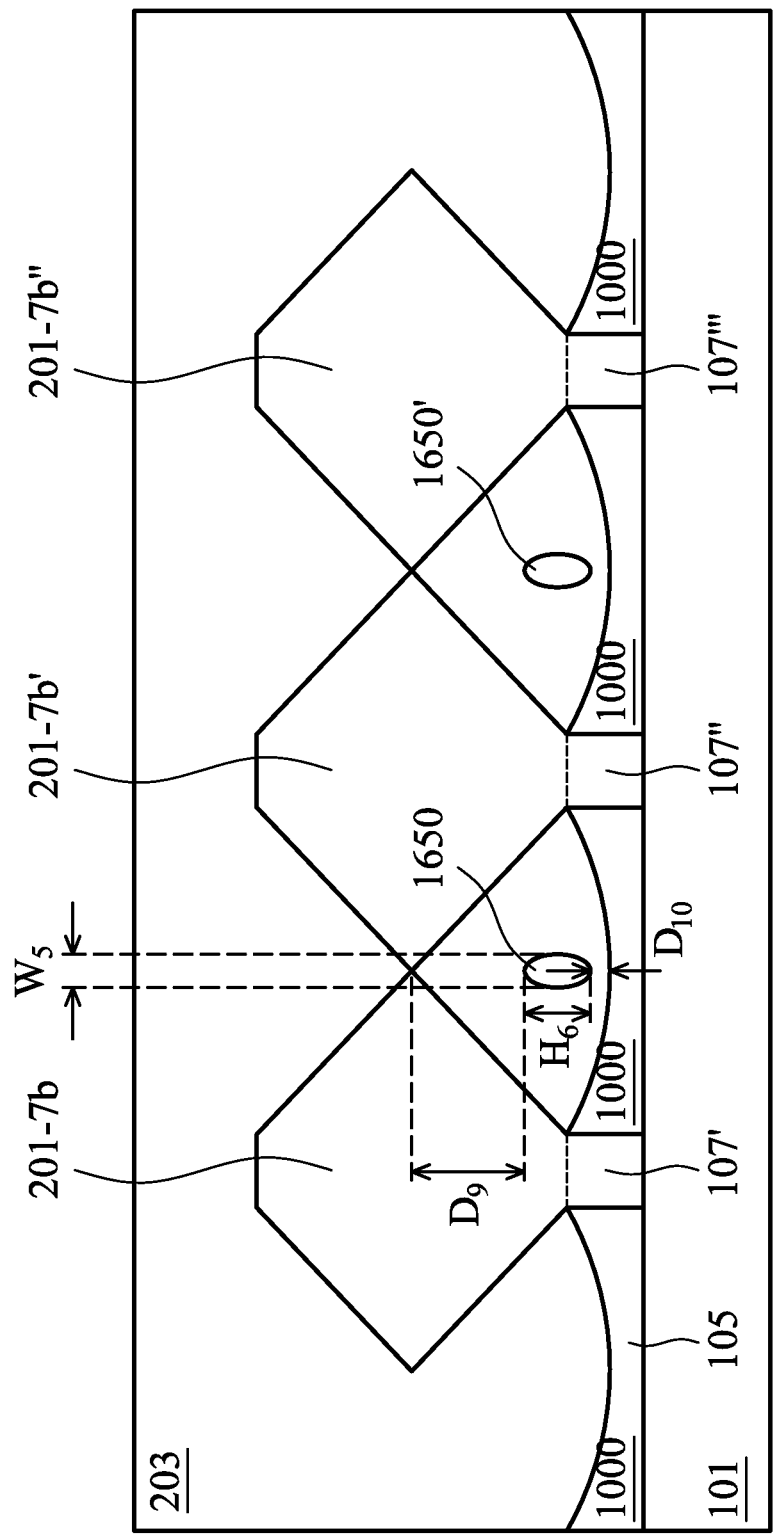

FIG. 15 representatively illustrates an embodiment where the duration of the deposition (e.g., by CVD) of the ILD 203 may be extended or otherwise tuned to form smaller void regions 1650, 1650' underlying discrete epitaxial structures 201-7b, 201-7b', 201-7b" (as described above with respect to FIG. 10). In a particular embodiment the time of deposition in this embodiment may be extended to be longer than the time described above with respect to FIG. 10, while still being between about 100 seconds and about 800 seconds. Such a time forms void regions 1650, 1650' to have a sixth height $H_6$ of between about 2 nm and about 8 nm and a fifth width $W_5$ of between about 3 nm and about 5 nm. However, any suitable time and dimensions may be utilized.

Additionally, the void regions 1650, 1650' may be formed such that the void regions 1650, 1650' are separated from both the epitaxial structures 201-7b, 201-7b', 201-7b" as well as the first isolation regions 105. For example, in some embodiments the void regions 1650, 1650' may be spaced apart from the point of contact between epitaxial structures 201-7b, 201-7b', 201-7b" (in a direction perpendicular to a major surface of the substrate 101) a ninth distance $D_9$ of between about 10 nm and about 50 nm, such as about 25 nm. Similarly, the void regions 1650, 1650' may be spaced apart from the first isolation regions 105 a tenth distance $D_{10}$ of between about 1 nm and about 10 nm, such as about 3 nm. As such, a ratio between the ninth distance $D_9$ and the tenth distance $D_{10}$ may be between about 10 and about 501, such as about 8, while a ratio of the tenth distance $D_{10}$ and the distance of concavity $D_c$ is between about 0.5 and about 5, such as about 1. However, any suitable distances and ratios may be utilized.

Figure 16:
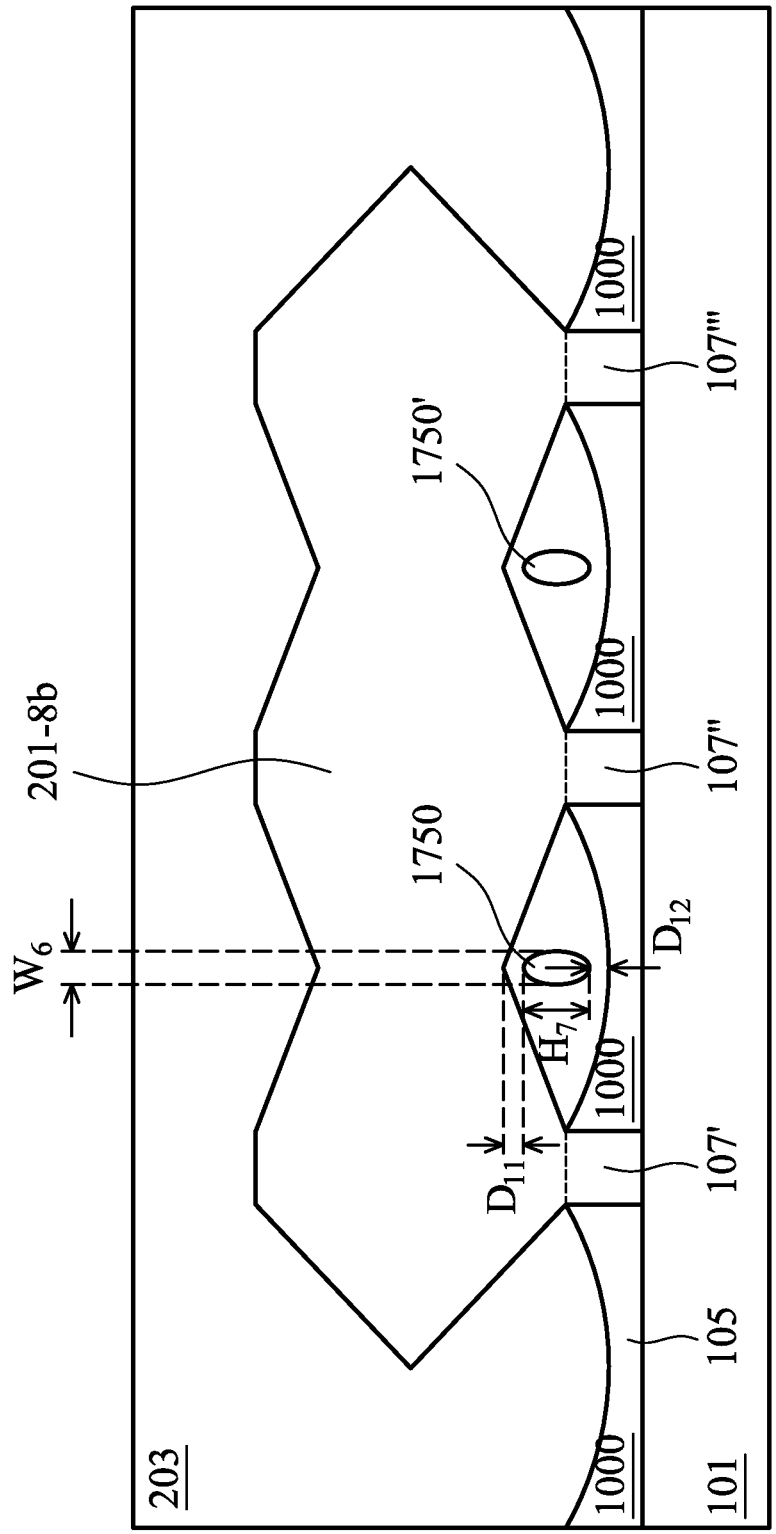

FIG. 16 representatively illustrates an embodiment where the duration of the deposition of the ILD 203 may be extended or otherwise tuned to form smaller void regions 1750, 1750' under merged epitaxial structure 201-8b (as described above with respect to FIG. 12). In a particular embodiment the time of deposition in this embodiment may be extended to be longer than the time described above with respect to FIG. 12, while still being between about 100 seconds and about 800 seconds. Such a time forms void regions 1750, 1750' to have a height of less than about 10 nm and a sixth width $W_6$ of less than about 5 nm. However, any suitable time and dimensions may be utilized.

Additionally, the void regions 1750, 1750' may be formed such that the void regions 1750, 1750' are separated from both the merged epitaxial structure 201-8b as well as the first isolation regions 105. For example, in some embodiments the void regions 1750, 1750' may be spaced apart from the merged epitaxial structure 201-8b (in a direction perpendicular to a major surface of the substrate 101) an eleventh distance $D_{11}$ of between about 1 nm and about 20 nm, such as about 5 nm. Similarly, the void regions 1750, 1750' may be spaced apart from the first isolation regions 105 a twelfth distance $D_{12}$ of between about 1 nm and about 10 nm, such as about 3 nm. As such, a ratio between the eleventh distance $D_{11}$ and the twelfth distance $D_{12}$ may be between about 1 and about 20, such as about 1.6, while a ratio of the twelfth distance $D_{12}$ and the distance of concavity $D_c$ is between about 0.5 and about 3, such as about 1. However, any suitable distances and ratios may be utilized.

Figure 17:
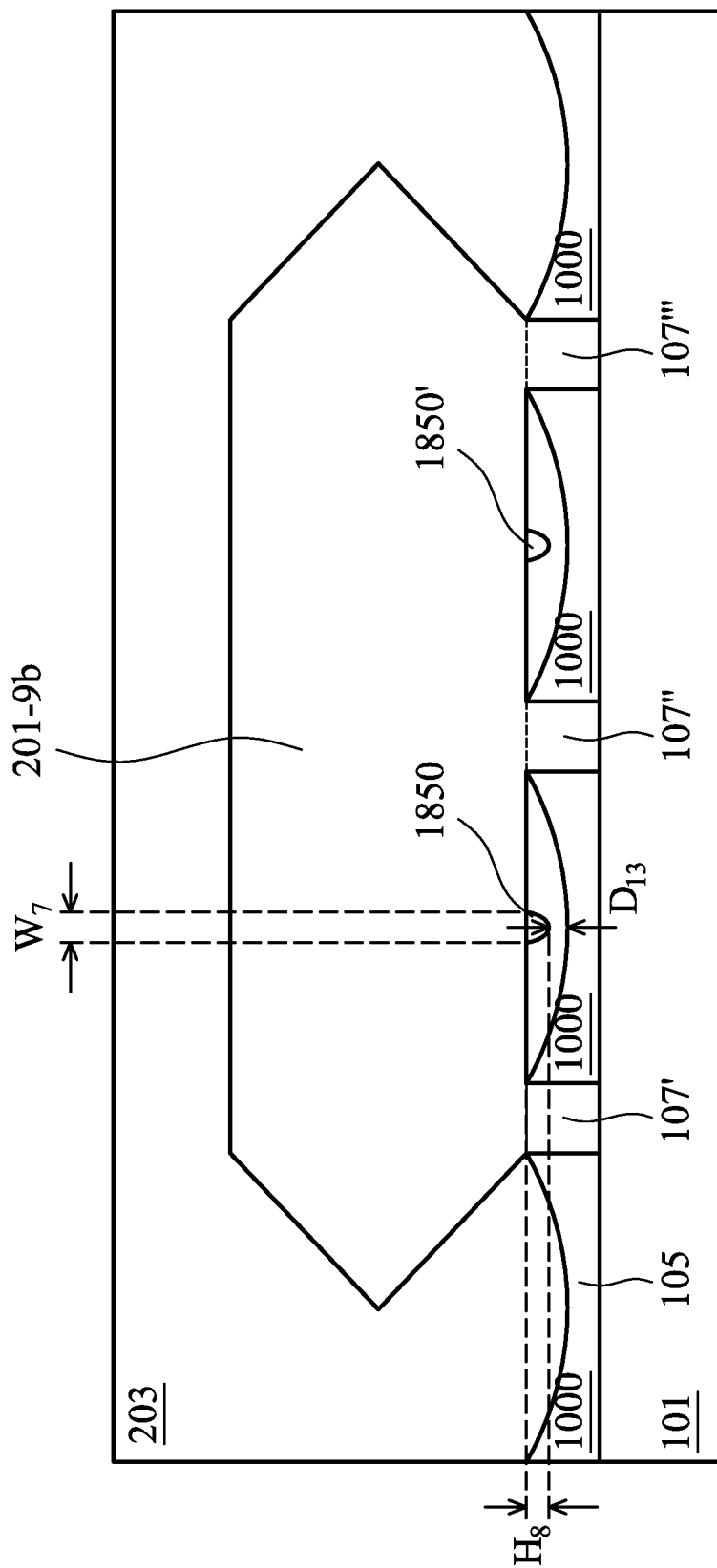

FIG. 17 representatively illustrates an embodiment where the duration of the deposition of the ILD 203 may be extended or otherwise tuned to form smaller void regions 1850, 1850' under merged epitaxial structure 201-9b (as described above with respect to FIG. 14). In a particular embodiment the time of deposition in this embodiment may be extended to be longer than the time described above with respect to FIG. 14, while still being between about 100 seconds and about 800 seconds. Such a time forms void regions 1850, 1850' to have an eighth height $H_8$ of less than about 8 nm and a seventh width $W_7$ of less than about 3 nm. However, any suitable time and dimensions may be utilized.

Additionally, while the void regions 1850, 1850' may be formed such that the void regions 1850, 1850' expose a bottom surface of the epitaxial structure 201-9b, the void regions 1850, 1850' may also be formed to be separated from the first isolation regions 105. For example, in some embodiments the void regions 1850, 1850' may be spaced apart from the first isolation regions 105 a thirteenth distance $D_{13}$ of between about 1 nm and about 10 nm, such as about 5 nm. As such, a ratio between the eighth height $H_8$ and the thirteenth distance $D_{13}$ may be between about 1 nm and about 10 nm, such as about 3 nm while a ratio of the thirteenth distance $D_{13}$ and the distance of concavity $D_c$ is between about 1 and about 10, such as about 1.8. However, any suitable distances and ratios may be utilized.

Figure 18:
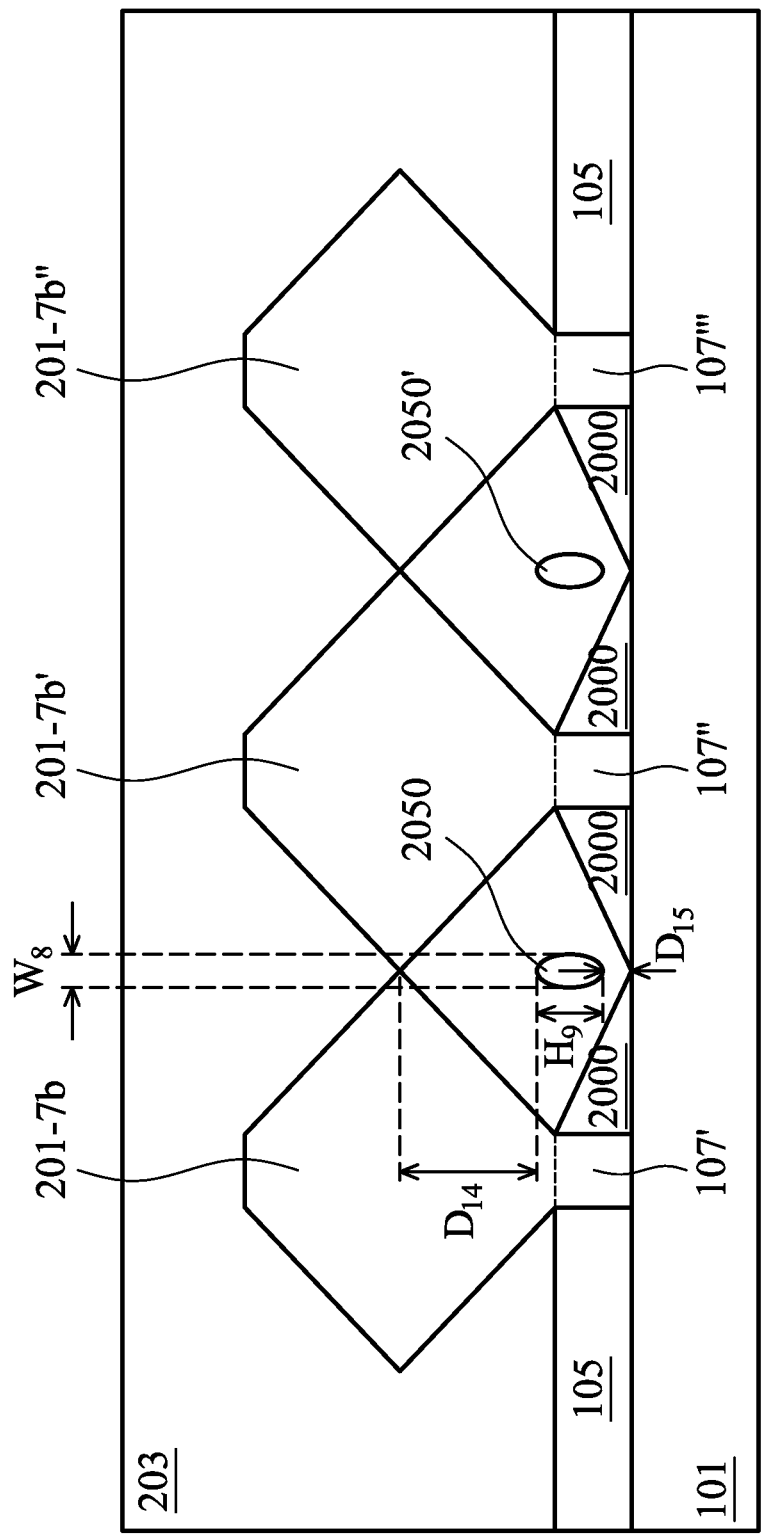

FIG. 18 representatively illustrates an embodiment where ILD void regions 2050, 2050' are formed over tapered recessed portions 2000. In accordance with representative embodiments, in order to obtain the tapered recessed portions 2000, the first isolation regions 105 are formed with a first main etching step. In an embodiment the first main etching step may be the process described above with respect to the recessing to form the first isolation regions 105. For example, in the main etching step, a plasma from a one or more etchants including $CH_4$, $CF_4$, $CH_2F_2$, $CHF_3$, $O_2$, HBr, $Cl_2$, $NF_3$, $N_2$ and/or He may be utilized to etch the dielectric material and form the first isolation region. The main etching step may be performed at a pressure of between about 3 mTorr to about 20 mTorr and a temperature of between about 30° C. and about 80° C., although any suitable temperature and pressure may be utilized.

Once the first isolation regions 105 have been formed, the outer first isolation regions 105 (those not located between adjacent fins 107), may be masked, and a series of overetches may be performed on the inner first isolation regions 105 (those located between the fins 107) to form the tapered recessed portions 2000. In an embodiment a first overetch may be a simple continuation of the main etch and may be performed for a time period after the normal endpoint of the main etch to form the first isolation regions 105. In a particular embodiment the first overetch may be continued pass the time of the main etch for a time of between about 30% to about 80% of the main etch. However, any suitable amount of time may be utilized.

A second overetch is used to form the final tapered shape of the tapered recess portions 2000 and uses a plasma from a one or more etchants including $CH_3F$, $CH_4$, $CF_4$, $CH_2F_2$, $CHF_3$, $O_2$, HBr, $Cl_2$, $NF_3$, $N_2$, $SF_6$ and/or He may be utilized to etch the first isolation region 105. The second overetch step may be performed at a pressure of between about 5 mTorr to about 10 mTorr and a temperature of between about 30° C. and about 60° C., although any suitable temperature and pressure may be utilized.

Once the first isolation region 105 has been formed, processing may be continued as described above through the formation of the ILD layer 203. However, by forming the tapered shape, the void regions 2050, 2050' may be formed such that the void regions 2050, 2050' are separated from both the epitaxial structures 201-7b, 201-7b', 201-7b" as well as the first isolation regions 105. For example, in some embodiments the void regions 2050, 2050' may be spaced apart from the epitaxial structures 201-7b, 201-7b', 201-7b" (in a direction perpendicular to a major surface of the substrate 101) a fourteenth distance $D_{14}$ of between about 5 nm and about 25 nm, such as about 40 nm. Similarly, the void regions 2050, 2050' may be spaced apart from the first isolation regions 105 a fifteenth distance $D_{15}$ of between about 1 nm and about 5 nm, such as about 2 nm. As such, a ratio between the fourteenth distance $D_{14}$ and the fifteenth distance $D_{15}$ may be between about 1 nm and about 8 nm, such as about 2 nm, while a ratio of the fifteenth distance $D_{15}$ and the distance of concavity $D_c$ is between about 1 and about 20, such as about 2. Additionally, the void regions 2050, 2050' may be formed to have a ninth height $H_9$ of between about 5 nm and about 15 nm, such as about 10 nm, and an eighth width $W_8$ of between about 1 nm and about 10 nm, such as about 3 nm. However, any suitable distances and ratios may be utilized.

By utilizing the process and structures as described herein, the epitaxial profile of the source/drain regions may be stabilized. As such, degradation of Ion-Ioff and drain induced barrier lowering may be minimized. Such minimization can improve device uniformity and help improve wafer acceptance test results.

In an embodiment, a semiconductor device, includes: a first fin and a second fin disposed over a substrate; a gate stack disposed over the first fin and the second fin; an epitaxial source/drain region disposed adjacent the gate stack and over the first fin and the second fin; a dielectric layer having a first portion disposed over the epitaxial source/drain region and a second portion disposed under the epitaxial source/drain region, the second portion of the dielectric layer being disposed between the first fin and the second fin, the second portion of the dielectric layer having a void region therein; and a source/drain contact extending through the first portion of the dielectric layer to couple the epitaxial source/drain region.

In some embodiments, the semiconductor device further includes: an isolation region disposed between the first fin and the second fin, the second portion of the dielectric layer being disposed between the isolation region and the epitaxial source/drain region. In some embodiments of the semiconductor device, the isolation region has an upper surface that is substantially planar, concave, or v-shaped. In some embodiments of the semiconductor device, the void region is separated from the isolation region by the dielectric layer. In some embodiments of the semiconductor device, the void region is separated from the epitaxial source/drain region by the dielectric layer. In some embodiments of the semiconductor device, the void region exposes a surface of the epitaxial source/drain region. In some embodiments of the semiconductor device, an upper surface of the epitaxial source/drain region has an irregular topology. In some embodiments of the semiconductor device, an upper surface of the epitaxial source/drain region has a planar topology.

In an embodiment, a semiconductor device, includes: an isolation region disposed over a substrate; a first fin and a second fin extending from between neighboring portions of the isolation region; a gate stack disposed over the first fin, the second fin, and the isolation region; a first epitaxial source/drain region disposed adjacent the gate stack; a dielectric layer having a first portion disposed over the first epitaxial source/drain region and a second portion disposed between the first epitaxial source/drain region and the isolation region, the second portion of the dielectric layer having a void region therein, the void region being separated from the isolation region by the dielectric layer; and a source/drain contact extending through the first portion of the dielectric layer to couple the first epitaxial source/drain region.

In some embodiments of the semiconductor device, the first epitaxial source/drain region is disposed over the first fin and the second fin. In some embodiments of the semiconductor device, an upper surface of the first epitaxial source/drain region has an irregular topology. In some embodiments of the semiconductor device, an upper surface of the first epitaxial source/drain region has a planar topology. In some embodiments of the semiconductor device, the void region is separated from the first epitaxial source/drain region by the dielectric layer. In some embodiments of the semiconductor device, the void region exposes a surface of the first epitaxial source/drain region. In some embodiments of the semiconductor device, the first epitaxial source/drain region is disposed over the first fin, and further including: a second epitaxial source/drain region disposed adjacent the gate stack and over the second fin, the second epitaxial source/drain region contacting the first epitaxial source/drain region. In some embodiments of the semiconductor device, the void region is disposed under contacting portions of the first epitaxial source/drain region and the second epitaxial source/drain region. In some embodiments of the semiconductor device, the contacting portions of the first epitaxial source/drain region and the second epitaxial source/drain region include a boundary of the void region.

In an embodiment, a method includes: forming a plurality of fin structures over a substrate; forming a plurality of isolation structures laterally between respective pairs of the plurality of fin structures; etching an upper portion of the plurality of fin structures; growing an epitaxial source/drain region over respective ones of the plurality of fin structures; and depositing a dielectric layer over and on the epitaxial source/drain region, a plurality of void regions being formed in the dielectric layer during the depositing, each of the plurality of void regions being laterally between respective pairs of the plurality of fin structures.

In some embodiments of the method, etching the upper portion of the plurality of fin structures further includes etching the plurality of isolation structures. In some embodiments, the method further includes: etching an opening in the dielectric layer to expose the epitaxial source/drain region; and forming a source/drain contact in the opening to couple the epitaxial source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin and a second fin disposed over a substrate;
    a gate stack disposed over the first fin and the second fin;
    an epitaxial source/drain region disposed adjacent the gate stack and over the first fin and the second fin, the epitaxial source/drain region comprising a single semiconductor material extending continuously between the first fin and the second fin;
    a dielectric layer having a first portion disposed over the epitaxial source/drain region and a second portion disposed under the epitaxial source/drain region, the second portion of the dielectric layer being disposed between the first fin and the second fin, the second portion of the dielectric layer having a void region therein; and
    a source/drain contact extending through the first portion of the dielectric layer to couple the epitaxial source/drain region.

2. The semiconductor device of claim 1 further comprising:
    an isolation region disposed between the first fin and the second fin, the second portion of the dielectric layer being disposed between the isolation region and the epitaxial source/drain region.

3. The semiconductor device of claim 2, wherein the isolation region has an upper surface that is substantially planar, concave, or v-shaped.

4. The semiconductor device of claim 2, wherein the void region is separated from the isolation region by the dielectric layer.

5. The semiconductor device of claim 1, wherein the void region is separated from the epitaxial source/drain region by the dielectric layer.

6. The semiconductor device of claim 1, wherein the void region exposes a surface of the epitaxial source/drain region.

7. The semiconductor device of claim 1, wherein an upper surface of the epitaxial source/drain region has an irregular topology.

8. The semiconductor device of claim 1, wherein an upper surface of the epitaxial source/drain region has a planar topology.

9. A semiconductor device, comprising:
    an isolation region disposed over a substrate;
    a first fin and a second fin extending from between neighboring portions of the isolation region;
    a gate stack disposed over the first fin, the second fin, and the isolation region;
    a first epitaxial source/drain region disposed adjacent the gate stack, the first epitaxial source/drain region comprising a single continuous semiconductor material contacting each of the first fin and the second fin;
    a dielectric layer having a first portion disposed over the first epitaxial source/drain region and a second portion disposed between the first epitaxial source/drain region and the isolation region, the second portion of the dielectric layer having a void region therein, the void region being separated from the isolation region by the dielectric layer; and
    a source/drain contact extending through the first portion of the dielectric layer to couple the first epitaxial source/drain region.

10. The semiconductor device of claim 9, wherein the first epitaxial source/drain region is disposed over the first fin and the second fin.

11. The semiconductor device of claim 10, wherein an upper surface of the first epitaxial source/drain region has an irregular topology.

12. The semiconductor device of claim 10, wherein an upper surface of the first epitaxial source/drain region has a planar topology.

13. The semiconductor device of claim 10, wherein the void region is separated from the first epitaxial source/drain region by the dielectric layer.

14. The semiconductor device of claim 10, wherein the void region exposes a surface of the first epitaxial source/drain region.

15. The semiconductor device of claim 9, wherein the first epitaxial source/drain region is disposed over the first fin, and further comprising:
a second epitaxial source/drain region disposed adjacent the gate stack and over the second fin, the second epitaxial source/drain region contacting the first epitaxial source/drain region.

16. The semiconductor device of claim 15, wherein the void region is disposed under contacting portions of the first epitaxial source/drain region and the second epitaxial source/drain region.

17. The semiconductor device of claim 16, wherein the contacting portions of the first epitaxial source/drain region and the second epitaxial source/drain region comprise a boundary of the void region.

18. A method comprising:
forming a plurality of fin structures over a substrate;
forming a plurality of isolation structures laterally between respective pairs of the plurality of fin structures;
etching an upper portion of the plurality of fin structures, wherein etching the upper portion of the plurality of fin structures further comprises etching the plurality of isolation structures;
growing an epitaxial source/drain region over respective ones of the plurality of fin structures, wherein the epitaxial source/drain region comprises a single continuous semiconductor material; and
depositing a dielectric layer over and on the epitaxial source/drain region, a plurality of void regions being formed in the dielectric layer during the depositing, each of the plurality of void regions being laterally between respective pairs of the plurality of fin structures.

19. The method of claim 18 further comprising:
etching an opening in the dielectric layer to expose the epitaxial source/drain region; and
forming a source/drain contact in the opening to couple the epitaxial source/drain region.

20. The method of claim 18, wherein the plurality of isolation structures have upper surfaces that are concave or V-shaped.

* * * * *